(12) United States Patent
Hua et al.

(10) Patent No.: US 11,756,329 B2
(45) Date of Patent: Sep. 12, 2023

(54) FINGERPRINT DETECTION ARRAY SUBSTRATE, FINGERPRINT DETECTION APPARATUS, METHOD OF OPERATING FINGERPRINT DETECTION APPARATUS

(71) Applicants: BEIJING BOE OPTOELECTRONICS TECHNOLOGY CO., LTD., Beijing (CN); BOE Technology Group Co., Ltd., Beijing (CN)

(72) Inventors: Gang Hua, Beijing (CN); Yong Zhang, Beijing (CN); Haobo Fang, Beijing (CN); Jian Lin, Beijing (CN); Limin Zhang, Beijing (CN); Zhichao Yang, Beijing (CN); Yawei Zhang, Beijing (CN); Xianglei Qin, Beijing (CN); Zepeng Sun, Beijing (CN)

(73) Assignees: BEIJING BOE OPTOELECTRONICS TECHNOLOGY CO., LTD., Beijing (CN); BOE Technology Group Co., Ltd., Beijing (CN)

( * ) Notice: Subject to any disclaimer, the term of this patent is extended or adjusted under 35 U.S.C. 154(b) by 587 days.

(21) Appl. No.: 16/968,592

(22) PCT Filed: Nov. 1, 2019

(86) PCT No.: PCT/CN2019/115081
§ 371 (c)(1),
(2) Date: Aug. 8, 2020

(87) PCT Pub. No.: WO2021/081991
PCT Pub. Date: May 6, 2021

(65) Prior Publication Data
US 2023/0177865 A1    Jun. 8, 2023

(51) Int. Cl.
*G06V 40/13* (2022.01)
*G06F 3/041* (2006.01)
(Continued)

(52) U.S. Cl.
CPC ........ *G06V 40/1318* (2022.01); *G06F 3/0443* (2019.05); *G06F 3/0446* (2019.05);
(Continued)

(58) Field of Classification Search
None
See application file for complete search history.

(56) References Cited

U.S. PATENT DOCUMENTS 10,115,001 B2 * 10/2018 Benkley, III ....... G06V 40/1306
11,200,396 B2 * 12/2021 Chang ................. G06F 3/04164
(Continued)

OTHER PUBLICATIONS

International Search Report & Written Opinion dated Aug. 5, 2020, regarding PCT/CN2019/115081.

*Primary Examiner* — Duane N Taylor, Jr.
(74) *Attorney, Agent, or Firm* — Intellectual Valley Law, P.C.

(57) ABSTRACT

A fingerprint detection array substrate is provided. The fingerprint detection array substrate includes a plurality of touch electrode blocks in a plurality of touch detection regions configured to detect a touch position, wherein touch electrode blocks in a respective one of the plurality of touch detection regions are inter-connected through bridges, forming a touch electrode unit, and the touch electrode unit is isolated from touch electrode blocks in adjacent touch detection regions of the plurality of touch detection regions; a plurality of touch signal lines configured to respectively transmit touch signals to a plurality of touch detection regions, wherein a respective one of the plurality of touch signal lines is electrically connected to the touch electrode unit limited in the respective one of the plurality of touch
(Continued)

detection regions; and a fingerprint sensor configured to perform fingerprint sensing limited in a fingerprint scanning region.

19 Claims, 18 Drawing Sheets

(51) Int. Cl.
*G06F 3/044* (2006.01)
*H01L 27/146* (2006.01)

(52) U.S. Cl.
CPC .... *G06F 3/04164* (2019.05); *H01L 27/14616* (2013.01); *H01L 27/14623* (2013.01); *H01L 27/14678* (2013.01); *G06F 2203/04107* (2013.01); *G06F 2203/04111* (2013.01)

(56) References Cited

U.S. PATENT DOCUMENTS

| | | |
|---|---|---|
| 2014/0047706 A1 | 2/2014 | Shaikh et al. |
| 2017/0344787 A1 | 11/2017 | Cho et al. |
| 2018/0113558 A1 | 4/2018 | Cho et al. |
| 2019/0138123 A1* | 5/2019 | Jung .................... G06F 3/0446 |
| 2019/0155429 A1* | 5/2019 | Kim ..................... G06F 3/0412 |

* cited by examiner

FINGERPRINT DETECTION ARRAY SUBSTRATE, FINGERPRINT DETECTION APPARATUS, METHOD OF OPERATING FINGERPRINT DETECTION APPARATUS

CROSS-REFERENCE TO RELATED APPLICATION

This application is a national stage application under 35 U.S.C. § 371 of International Application No. PCT/CN2019/115081, filed Nov. 1, 2019, the contents of which are incorporated by reference in the entirety.

TECHNICAL FIELD

The present invention relates to display technology, more particularly, to a fingerprint detection array substrate, a fingerprint detection apparatus, and a method of operating a fingerprint detection apparatus.

BACKGROUND

In recent years, various methods have been proposed in fingerprint and palm print recognition. Examples of optical method for recognizing fingerprint and palm print include total reflection method, light-path separation method, and scanning method. In a total reflection method, light from a light source such as ambient light enters into a pixel, and is totally reflected on the surface of a package substrate. When a finger or palm touches the display panel, the total reflection condition of the surface changes locally upon touch, leading to a disruption of the total reflection locally. The disruption of the total reflection results in a reduced reflection. Based on this principle, the ridge lines of a finger may be differentiated from the valley lines. Alternatively, fingerprint and palm print may be recognized by detecting changes in capacitance when a finger or palm touches the display panel.

SUMMARY

In one aspect, the present invention provides a fingerprint detection array substrate, comprising a plurality of touch electrode blocks in a plurality of touch detection regions configured to detect a touch position, wherein a respective one of the plurality of touch electrode blocks extends substantially throughout a subpixel region of a respective subpixel, and is substantially outside an inter-subpixel region of the respective subpixel, touch electrode blocks in a respective one of the plurality of touch detection regions are inter-connected through bridges, forming a touch electrode unit, and the touch electrode unit is isolated from touch electrode blocks in adjacent touch detection regions of the plurality of touch detection regions; a plurality of touch signal lines configured to respectively transmit touch signals to the plurality of touch detection regions, wherein a respective one of the plurality of touch signal lines is electrically connected to the touch electrode unit limited in the respective one of the plurality of touch detection regions; a processor configure to determine a fingerprint scanning region comprising one or more touch detection regions in which the touch position is detected; and a fingerprint sensor configured to perform fingerprint sensing limited in the fingerprint scanning region, wherein an area of the fingerprint scanning region is a fraction of a total area of the plurality of touch detection regions.

Optionally, the respective one of the plurality of touch electrode blocks is electrically connected to a respective one of a plurality of photosensors of the fingerprint sensor.

Optionally, the fingerprint detection array substrate further comprises a substantially transparent conductive electrode on a side of the respective one of the plurality of photosensors away from a base substrate; and an insulating layer on a side of the substantially transparent conductive electrode away from the respective one of the plurality of photosensors; wherein the respective one of the plurality of touch electrode blocks extends through the insulating layer to connect with the substantially transparent conductive electrode.

Optionally, the plurality of touch electrode blocks and the substantially transparent conductive electrode are made of a same material.

Optionally, the fingerprint detection array substrate further comprises a plurality of thin film transistors respectively electrically connected to the plurality of photosensors; and a shielding layer comprising a plurality of light shielding blocks configured to at least partially shield light from irradiating on active layers of the plurality of thin film transistors; wherein a respective one of the plurality of light shielding blocks is electrically connected to the respective one of the plurality of touch electrode blocks; and an orthographic projection of the respective one of the plurality of light shielding blocks on a base substrate at least partially overlaps with an orthographic projection of an active layer of a respective one of the plurality of thin film transistors on the base substrate.

Optionally, the plurality of light shielding blocks and the plurality of touch signal lines are in a same layer and comprise a same conductive material.

Optionally, the fingerprint detection array substrate further comprises a passivation layer between the respective one of the plurality of light shielding blocks and the respective one of the plurality of touch electrode blocks; wherein the respective one of the plurality of light shielding blocks extends through the passivation layer to connect to the respective one of the plurality of touch electrode blocks; and the respective one of the plurality of touch signal lines extends through the passivation layer to connect to the respective one of the plurality of touch electrode blocks.

Optionally, the fingerprint detection array substrate further comprises a common electrode layer comprising a plurality of common electrode blocks, wherein a respective one of the plurality of common electrode blocks extends substantially throughout the subpixel region of the respective subpixel, and is substantially outside the inter-subpixel region of the respective subpixel; wherein the respective one of the plurality of common electrode blocks is electrically connected to a respective one of a plurality of photosensors of the fingerprint sensor, and configured to provide a common voltage to the respective one of the plurality of photosensors.

Optionally, the fingerprint detection array substrate further comprises a substantially transparent conductive electrode on a side of the respective one of the plurality of photosensors away from a base substrate; and an insulating layer on a side of the substantially transparent conductive electrode away from the respective one of the plurality of photosensors; wherein the respective one of the plurality of common electrode blocks extends through the insulating layer to connect with the substantially transparent conductive electrode.

Optionally, the plurality of common electrode blocks and the substantially transparent conductive electrode are made of a same material.

Optionally, the fingerprint detection array substrate further comprises a plurality of thin film transistors respectively electrically connected to the plurality of photosensors; and a shielding layer comprising a plurality of light shielding blocks configured to at least partially shield light from irradiating on active layers of the plurality of thin film transistors; wherein a respective one of the plurality of light shielding blocks is electrically connected to the respective one of the plurality of common electrode blocks; and an orthographic projection of the respective one of the plurality of light shielding blocks on a base substrate at least partially overlaps with an orthographic projection of an active layer of a respective one of the plurality of thin film transistors on the base substrate.

Optionally, the plurality of light shielding blocks and the plurality of touch signal lines are in a same layer and comprise a same conductive material.

Optionally, the respective one of the plurality of light shielding blocks is in direct contact with the respective one of the plurality of common electrode blocks without any intermediate layer.

Optionally, the plurality of touch signal lines are arranged along a first direction, a respective one of the plurality of touch signal lines extends along a second direction, the second direction is different from the first direction; and common electrode blocks in a row of the plurality of common electrode blocks along the second direction are inter-connected through common electrode bridges, and electrically connected to a common voltage source in a peripheral area of the fingerprint detection array substrate.

Optionally, the fingerprint detection array substrate further comprises a second insulating layer between the plurality of touch signal lines and the common electrode layer; wherein all of the plurality of common electrode blocks are inter-connected through common electrode bridges, and electrically connected to a common voltage source in a peripheral area of the fingerprint detection array substrate.

In another aspect, the present invention provides a fingerprint detection apparatus, comprising the fingerprint detection array substrate described herein or fabricated by a method described herein, and a counter substrate facing the fingerprint detection array substrate; wherein the fingerprint sensor comprises a plurality of light sources configured to emit light toward the counter substrate, at least a portion of the light being totally reflected by a surface of the counter substrate facing away the fingerprint detection array substrate; a plurality of photosensors in the fingerprint detection array substrate, and configured to detect the portion of the light totally reflected by the surface of the counter substrate facing away the fingerprint detection array substrate; and a fingerprint detection driver circuit electrically connected to the plurality of photosensors, and configured to independently control fingerprint detection respectively in a plurality of fingerprint scanning regions.

In another aspect, the present invention provides a method of operating a fingerprint detection apparatus, comprising detecting a touch position using a plurality of touch electrode blocks in a plurality of touch detection regions, wherein a respective one of the plurality of touch electrode blocks extends substantially throughout a subpixel region of a respective subpixel, and is substantially outside an inter-subpixel region of the respective subpixel, touch electrode blocks in a respective one of the plurality of touch detection regions are inter-connected through bridges, forming a touch electrode unit, the touch electrode unit is isolated from touch electrode blocks in adjacent touch detection regions of the plurality of touch detection regions; transmitting touch signals respectively through a plurality of touch signal lines to the plurality of touch detection regions, wherein a respective one of the plurality of touch signal lines is electrically connected to the touch electrode unit limited in the respective one of the plurality of touch detection regions; determining a fingerprint scanning region comprising the touch position detected; and performing fingerprint sensing limited in the fingerprint scanning region, wherein an area of the fingerprint scanning region is a fraction of a total area of the plurality of touch detection regions.

Optionally, the method further comprises operating the fingerprint detection apparatus in a time-division driving mode comprising a touch detection mode and a fingerprint detection mode, wherein the respective one of the plurality of touch electrode blocks is electrically connected to a respective one of a plurality of photosensors of a fingerprint sensor; in the fingerprint detection mode, transmitting a common voltage by the respective one of the plurality of touch signal lines to the respective one of the plurality of photosensors through the respective one of the plurality of touch electrode blocks; and in the touch detection mode, transmitting a touch signal by the respective one of the plurality of touch signal lines to the respective one of the plurality of touch detection regions.

Optionally, the method further comprises providing a common voltage to a respective one of a plurality of photosensors of a fingerprint sensor through a respective one of a plurality of common electrode blocks, wherein a respective one of the plurality of common electrode blocks extends substantially throughout the subpixel region of the respective subpixel, and is substantially outside the inter-subpixel region of the respective subpixel, the respective one of the plurality of common electrode blocks is electrically connected to the respective one of the plurality of photosensors.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
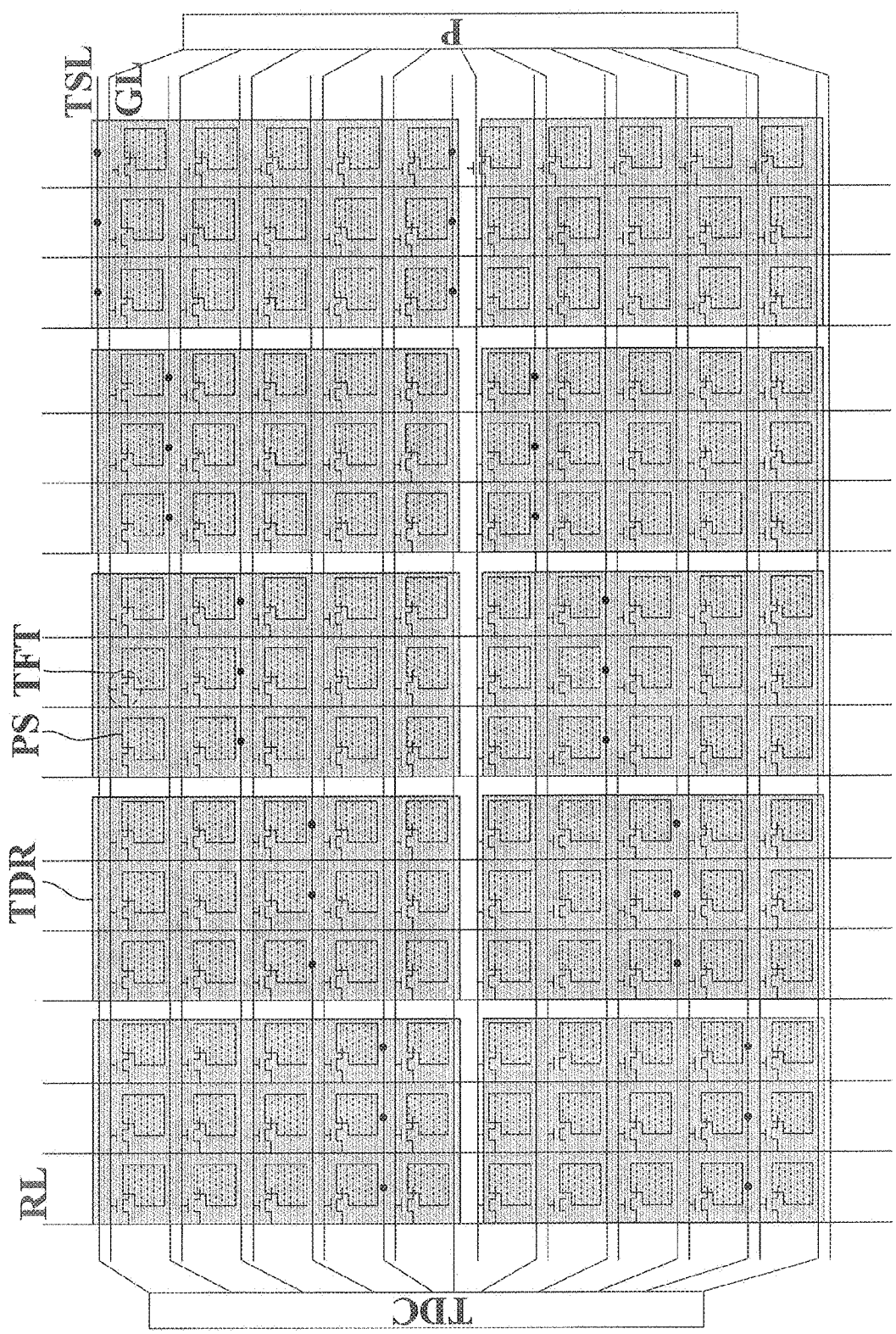
FIG. 1 is a schematic diagram illustrating the structure of a fingerprint detection array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a fingerprint detection array substrate, a fingerprint detection apparatus, and a method of operating a fingerprint detection apparatus that substantially obviate one or more of the problems due to limitations and disadvantages of the related art. In one aspect, the present disclosure provides a fingerprint detection array substrate. In some embodiments, the fingerprint detection array substrate includes a plurality of touch electrode blocks in a plurality of touch detection regions configured to detect a touch position, wherein a respective one of the plurality of touch electrode blocks extends substantially throughout a subpixel region of a respective subpixel, and is substantially outside an inter-subpixel region of the respective subpixel, touch electrode blocks in a respective one of the plurality of touch detection regions are interconnected through bridges, forming a touch electrode unit, and the touch electrode unit is isolated from touch electrode blocks in adjacent touch detection regions of the plurality of touch detection regions; a plurality of touch signal lines configured to respectively transmit touch signals to the plurality of touch detection regions, wherein a respective one of the plurality of touch signal lines is electrically connected to the touch electrode unit limited in the respective one of the plurality of touch detection regions; a processor configure to determine a fingerprint scanning region including one or more touch detection regions in which the touch position is detected; and a fingerprint sensor configured to perform fingerprint sensing limited in the fingerprint scanning region, wherein an area of the fingerprint scanning region is a fraction of a total area of the plurality of touch detection regions.

As used herein, a subpixel region refers to a light emission region of a subpixel, such as a region corresponding to a pixel electrode in a liquid crystal display, a region corresponding to a light emissive layer in an organic light emitting diode display panel, or a region corresponding to the light transmission layer in the present disclosure.

Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, an inter-subpixel region refers to a region between adjacent subpixel regions, such as a region corresponding to a black matrix in a liquid crystal display, a region corresponding a pixel definition layer in an organic light emitting diode display panel, or a region corresponding to a black matrix in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

FIG. 1 is a schematic diagram illustrating the structure of a fingerprint detection array substrate in some embodiments according to the present disclosure. Referring to FIG. 1, the fingerprint detection array substrate in some embodiments includes a plurality of touch detection regions TDR configured to detect a touch position; a plurality of touch signal lines TSL configured to respectively transmit touch signals to a plurality of touch detection regions TDR; a fingerprint sensor including a plurality of photosensors PS configured to detecting fingerprint information; a plurality of thin film transistors TFT respectively connected to the plurality of photosensors PS; a plurality of gate lines GL respectively connected to a plurality of rows of thin film transistors, and a plurality of read lines RL respectively connected to a plurality of columns of thin film transistors. The plurality of touch detection regions TDR are independently addressable. A respective one of the plurality of touch signal lines TSL is electrically connected to one or more touch electrodes limited in the respective one of the plurality of touch detection regions TDR, and is not connected to touch electrodes in other touch detection regions. The plurality of touch signal lines TSL are connected to a touch driving circuit TDC. The fingerprint detection array substrate further includes a processor P configured to determine a fingerprint scanning region including one or more touch detection regions of the plurality of touch detection regions TDR in which the touch position is detected. In one example, the processor P is connected to the plurality of gate lines GL. The fingerprint sensor is configured to perform fingerprint sensing limited in the fingerprint scanning region, wherein an area of the fingerprint scanning region is a fraction of a total area of the plurality of touch detection regions TDR.

Figure 2:
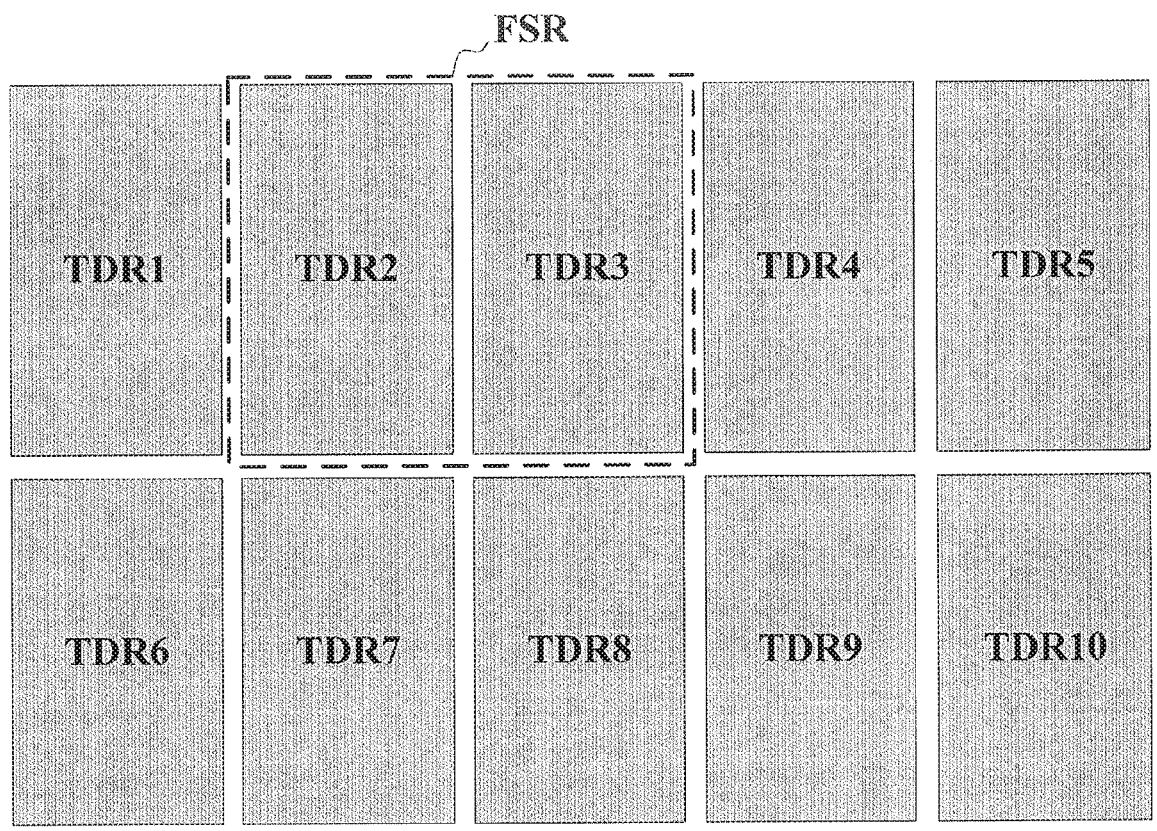
FIG. 2 illustrates determination of a fingerprint scanning region in a fingerprint detection array substrate in some embodiments according to the present disclosure.

FIG. 2 illustrates determination of a fingerprint scanning region in a fingerprint detection array substrate in some embodiments according to the present disclosure. Referring to FIG. 2, in one example, a touch position is detected in two touch detection regions (TDR2 and TDR3) of the plurality of touch detection regions TDR. The processor is configured to determine a fingerprint scanning region FSR that includes the two touch detection regions TDR2 and TDR3. The fingerprint sensor is configured to perform fingerprint sensing limited in the fingerprint scanning region FSR.

Figure 3:
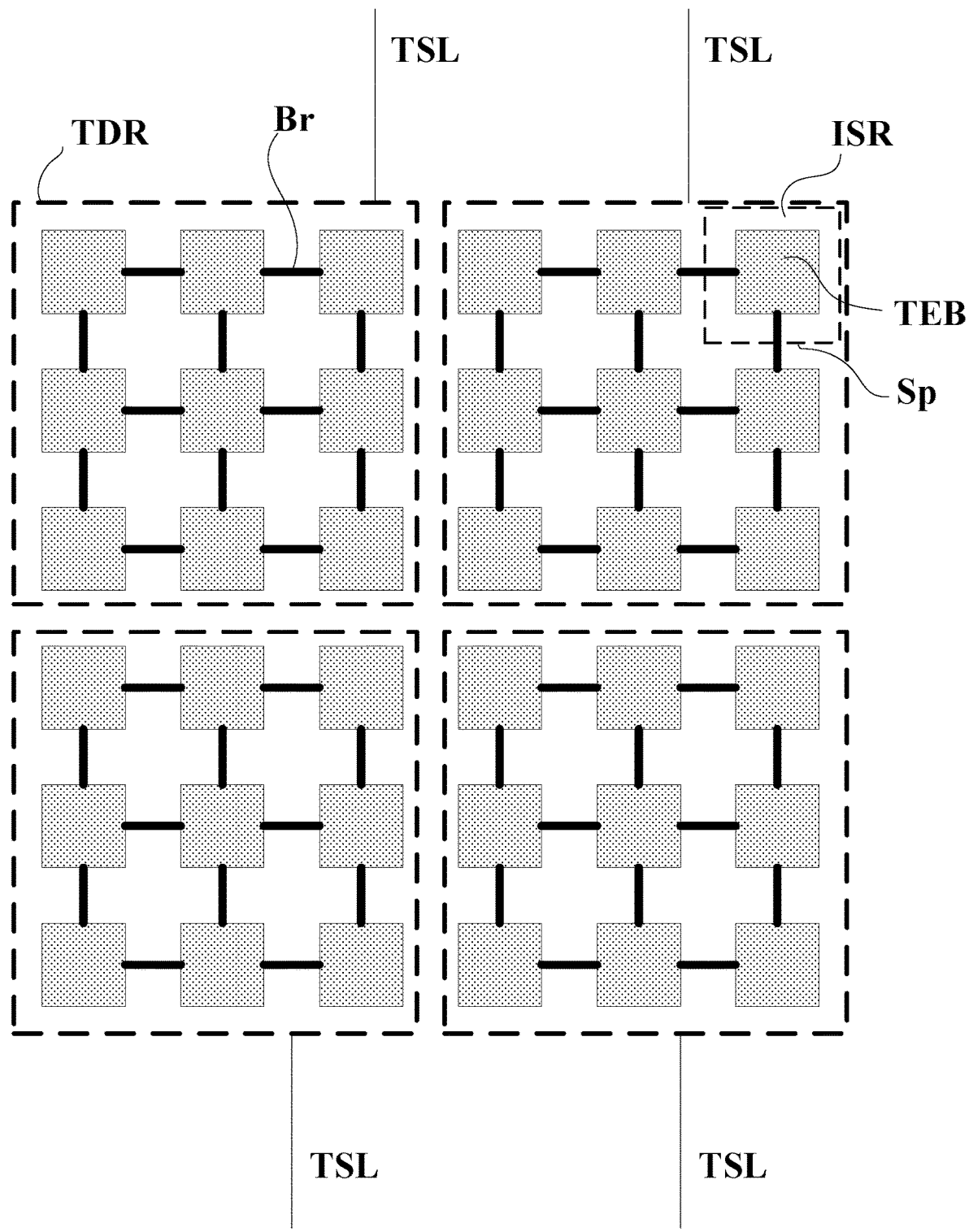
FIG. 3 is a schematic diagram illustrating the structure of a plurality of touch electrode blocks in a plurality of touch detection regions in a fingerprint detection array substrate in some embodiments according to the present disclosure.

FIG. 3 is a schematic diagram illustrating the structure of a plurality of touch electrode blocks in a plurality of touch detection regions in a fingerprint detection array substrate in some embodiments according to the present disclosure. Referring to FIG. 3, the fingerprint detection array substrate in some embodiments includes a plurality of touch electrode blocks TEB in a plurality of touch detection regions TDR. A respective one of the plurality of touch detection regions TDR includes multiple touch electrode blocks of the plurality of touch electrode blocks TEB. Touch electrode blocks in a respective one of the plurality of touch detection regions TDR are inter-connected through bridges Br, forming a touch electrode unit. The touch electrode unit is isolated from touch electrode blocks in adjacent touch detection regions of the plurality of touch detection regions TDR.

Figure 4:
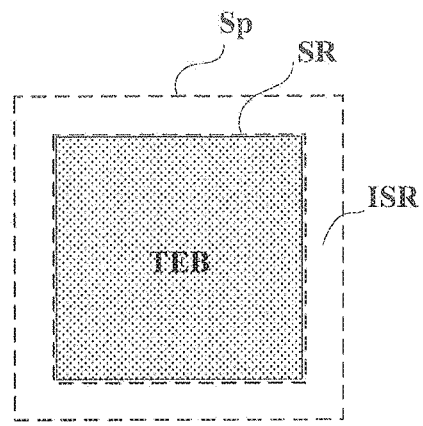
FIG. 4 is a schematic diagram illustrating the structure of a subpixel in a fingerprint detection array substrate in some embodiments according to the present disclosure.

FIG. 4 is a schematic diagram illustrating the structure of a subpixel in a fingerprint detection array substrate in some embodiments according to the present disclosure. Referring to FIG. 4, a respective one of the plurality of touch electrode blocks TEB extends substantially throughout a subpixel region SR of a respective subpixel Sp, and is substantially outside an inter-subpixel region ISR of the respective subpixel Sp.

In some embodiments, the fingerprint detection array substrate is operated in a time-division driving mode comprising a touch detection mode and a fingerprint detection mode. The respective one of the plurality of touch electrode blocks is electrically connected to a respective one of a plurality of photosensors of the fingerprint sensor. Optionally, in the fingerprint detection mode, the respective one of the plurality of touch signal lines is configured to transmit a common voltage to the respective one of the plurality of photosensors through the respective one of the plurality of touch electrode blocks. Optionally, in the touch detection mode, the respective one of the plurality of touch signal lines are configured to transmit a touch signal to the respective one of the plurality of touch detection regions.

Figure 5A:
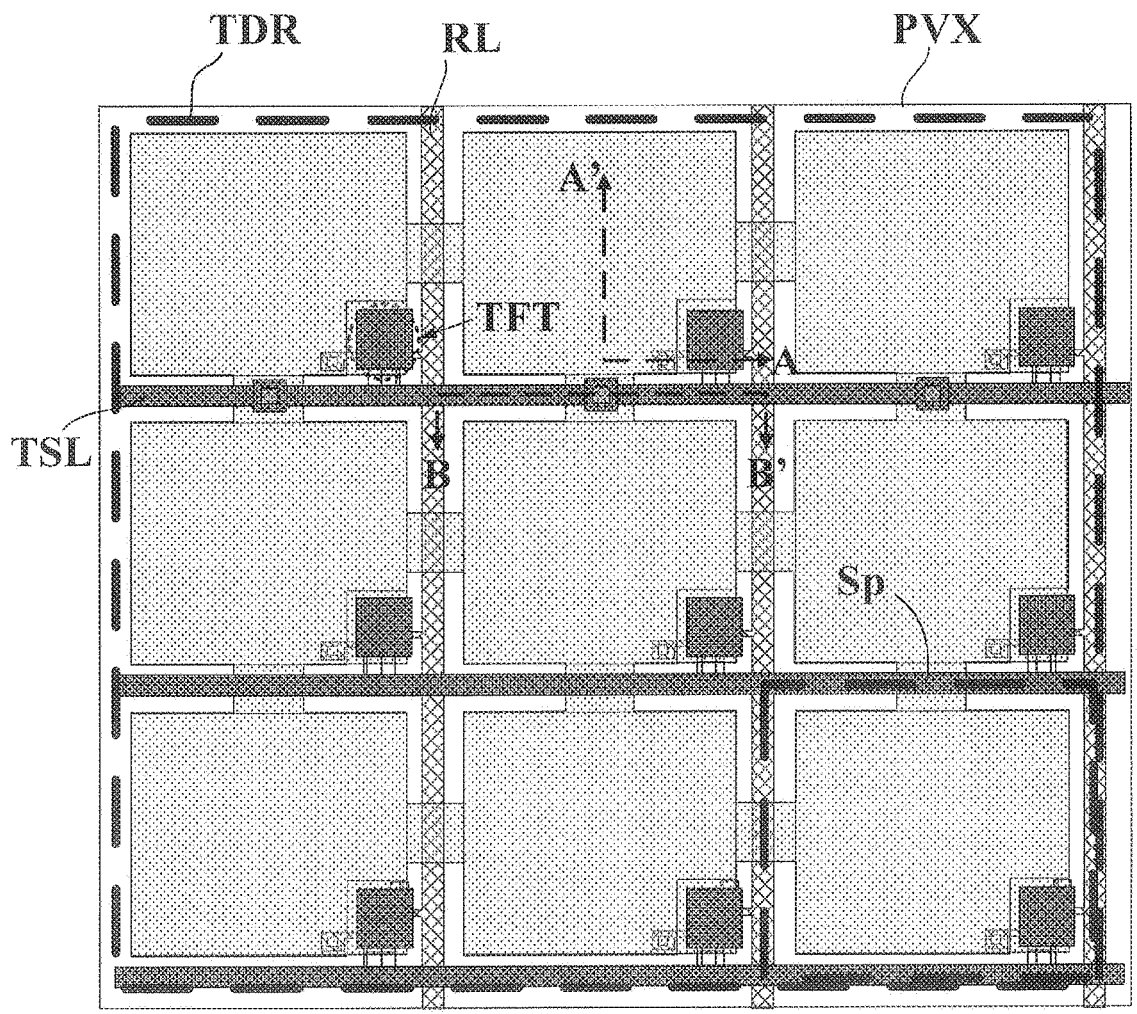
FIG. 5A is a plan view of a fingerprint detection array substrate in some embodiments according to the present disclosure.
Figure 5B:
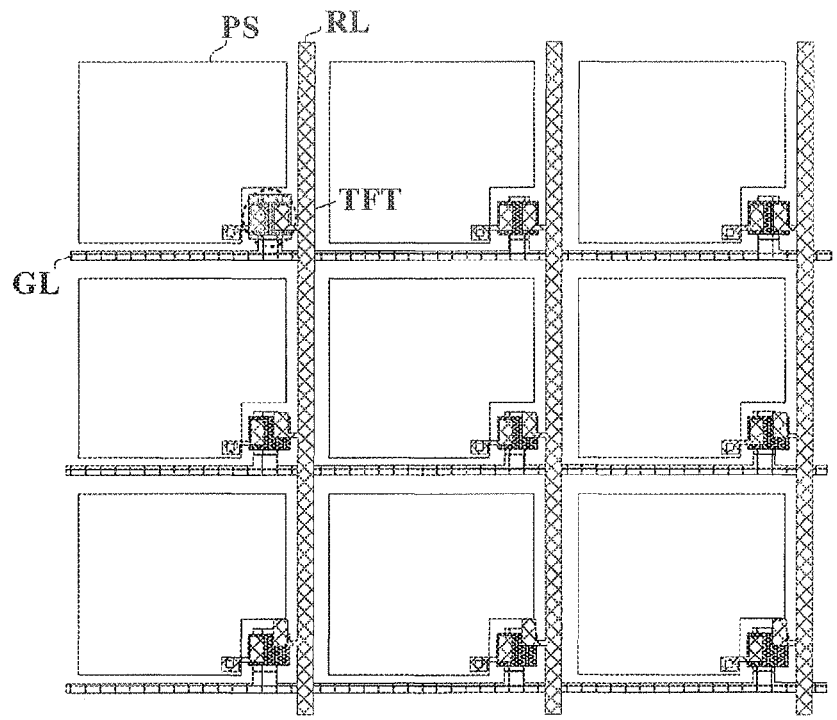
FIG. 5B is a plan view of a plurality of photosensors, a plurality of thin film transistors, a plurality of gate lines, and a plurality of read lines in a region corresponding to a touch electrode unit of a fingerprint detection array substrate in some embodiments according to the present disclosure.
Figure 5C:
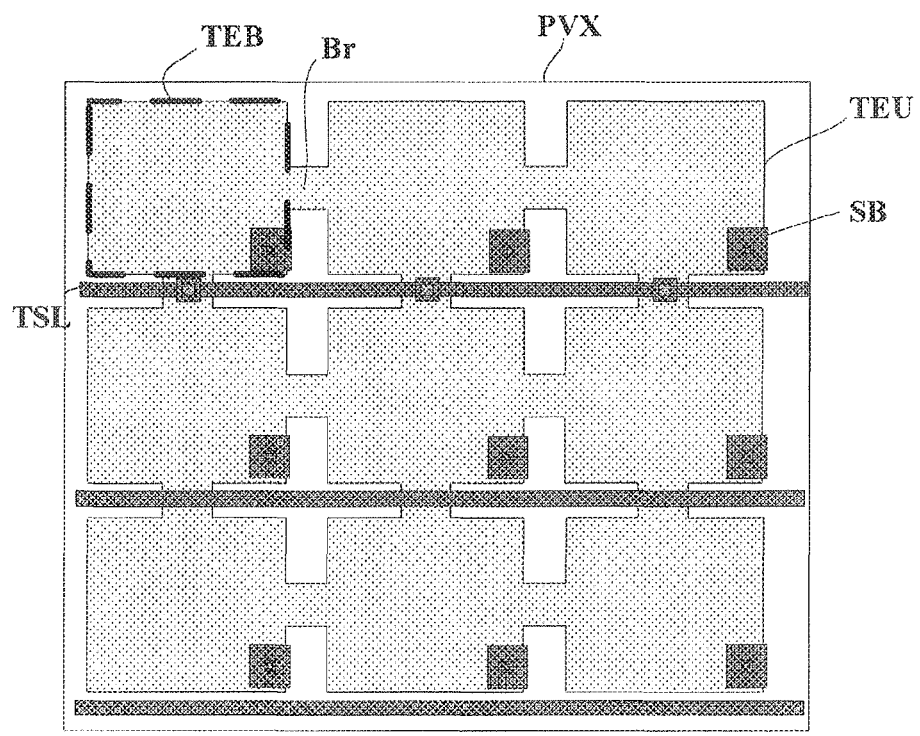
FIG. 5C is a plan view of a plurality of touch electrode blocks, a plurality of touch signal lines, and a passivation

FIG. 5A is a plan view of a fingerprint detection array substrate in some embodiments according to the present disclosure. FIG. 5B is a plan view of a plurality of photosensors, a plurality of thin film transistors, a plurality of gate lines, and a plurality of read lines in a region corresponding to a touch electrode unit of a fingerprint detection array substrate in some embodiments according to the present disclosure. FIG. 5C is a plan view of a plurality of touch electrode blocks, a plurality of touch signal lines, and a passivation layer between the plurality of touch signal lines and the plurality of touch electrode blocks, in a region corresponding to a touch electrode unit of a fingerprint detection array substrate in some embodiments according to the present disclosure. Referring to FIG. 5A to FIG. 5C, the fingerprint detection array substrate in some embodiments includes a plurality of gate lines GL and a plurality of read lines RL crossing over each other, defining a plurality of subpixels Sp. Optionally, the fingerprint detection array substrate further includes a plurality of touch signal lines TSL substantially parallel to the plurality of gate lines GL. The plurality of touch electrode blocks TEB are inter-connected through bridges Br, the plurality of touch electrode blocks TEB and the bridges Br forming a touch electrode unit TEU. As shown in FIG. 5A, FIG. 5C and FIG. 3, the plurality of touch electrode blocks TEB in a respective one of the plurality of touch detection regions TDR are inter-connected through the bridges Br, forming the touch electrode unit TEL, and the touch electrode unit TEU is isolated from touch electrode blocks in adjacent touch detection regions of the plurality of touch detection regions TDR.

Figure 6:
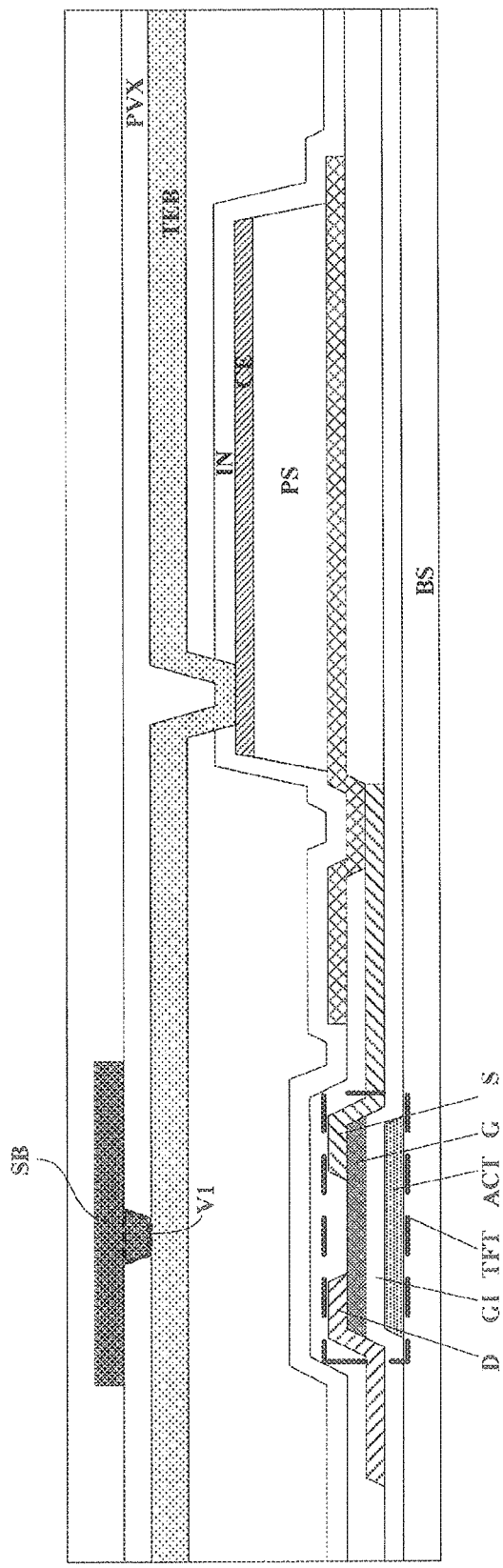
FIG. 6 is a cross-sectional view along an A-A' line in FIG. 5A.

FIG. 6 is a cross-sectional view along an A-A' line in FIG. 5A. Referring to FIGS. 5A-5C, and FIG. 6, in some embodiments, the fingerprint detection array substrate further includes a substantially transparent conductive electrode CE on a side of the respective one of the plurality of photosensors PS away from a base substrate BS; and an insulating layer IN on a side of the substantially transparent conductive electrode CE away from the respective one of the plurality of photosensors PS. Optionally, the substantially transparent conductive electrode CE is a bias electrode configured to provide a bias voltage to the respective one of the plurality of photosensors PS. The respective one of the plurality of touch electrode blocks TEB extends through the insulating layer IN to connect with the substantially transparent conductive electrode CE. Optionally, the plurality of touch electrode blocks TEB and the substantially transparent conductive electrode CE are made of a same material, e.g., indium tin oxide.

In some embodiments, the fingerprint detection array substrate further includes a plurality of thin film transistors TFT. A respective one of the plurality of thin film transistors TFT includes an active layer ACT, a gate electrode G, a source electrode S, and a drain electrode D. The respective one of the plurality of photosensors PS is electrically connected to the source electrode S. In some embodiments, the fingerprint detection array substrate further includes a shielding layer including a plurality of light shielding blocks SB configured to at least partially shield light from irradiating on the active layer ACT of the respective one of the plurality of thin film transistors TFT. Referring to FIG. 6, a respective one of the plurality of light shielding blocks SB is electrically connected to the respective one of the plurality of touch electrode blocks TEB. Referring to FIGS. 5A to 5C, and FIG. 6, an orthographic projection of the respective one of the plurality of light shielding blocks SB on the base substrate BS at least partially overlaps with an orthographic projection of the active layer ACT of the respective one of the plurality of thin film transistors TFT on the base substrate BS. Optionally, the orthographic projection of the respective one of the plurality of light shielding blocks SB on the base substrate BS covers the orthographic projection of the active layer ACT of the respective one of the plurality of thin film transistors TFT on the base substrate BS. Optionally, the plurality of light shielding blocks SB and the plurality of touch signal lines TSL are in a same layer and includes a same conductive material, e.g., a same metallic material.

In some embodiments, the fingerprint detection array substrate further includes a passivation layer PVX between the respective one of the plurality of light shielding blocks SB and the respective one of the plurality of touch electrode blocks TEB. Optionally, the respective one of the plurality of light shielding blocks SB extends through the passivation layer PVX to connect to the respective one of the plurality of touch electrode blocks TEB. The fingerprint detection array substrate includes a first via V1 extending through the passivation layer PVX, and the respective one of the plurality of light shielding blocks SB extends through the first via V1 to connect to the respective one of the plurality of touch electrode blocks TEB.

Figure 7:
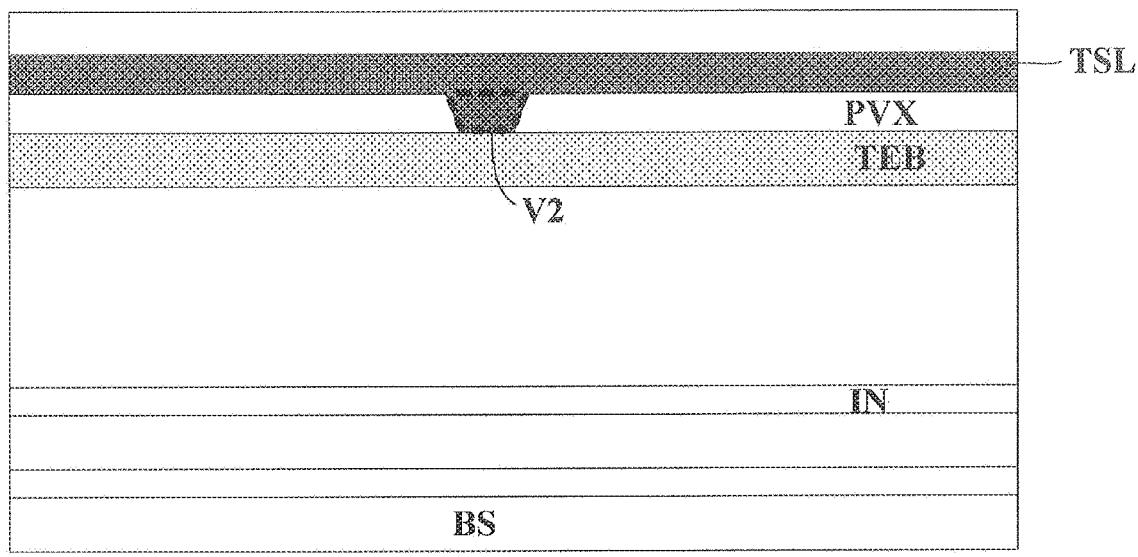
FIG. 7 is a cross-sectional view along a B-B' line in FIG. 5A.

FIG. 7 is a cross-sectional view along a B-B' line in FIG. 5A. Referring to FIG. 7, in some embodiments, the respective one of the plurality of touch signal lines TSL extends through the passivation layer PVX to connect to the respective one of the plurality of touch electrode blocks TEB. The fingerprint detection array substrate includes a second via V2 extending through the passivation layer PVX, and the respective one of the plurality of touch signal lines TSL extends through the second via V2 to connect to the respective one of the plurality of touch electrode blocks TEB.

Figure 8:
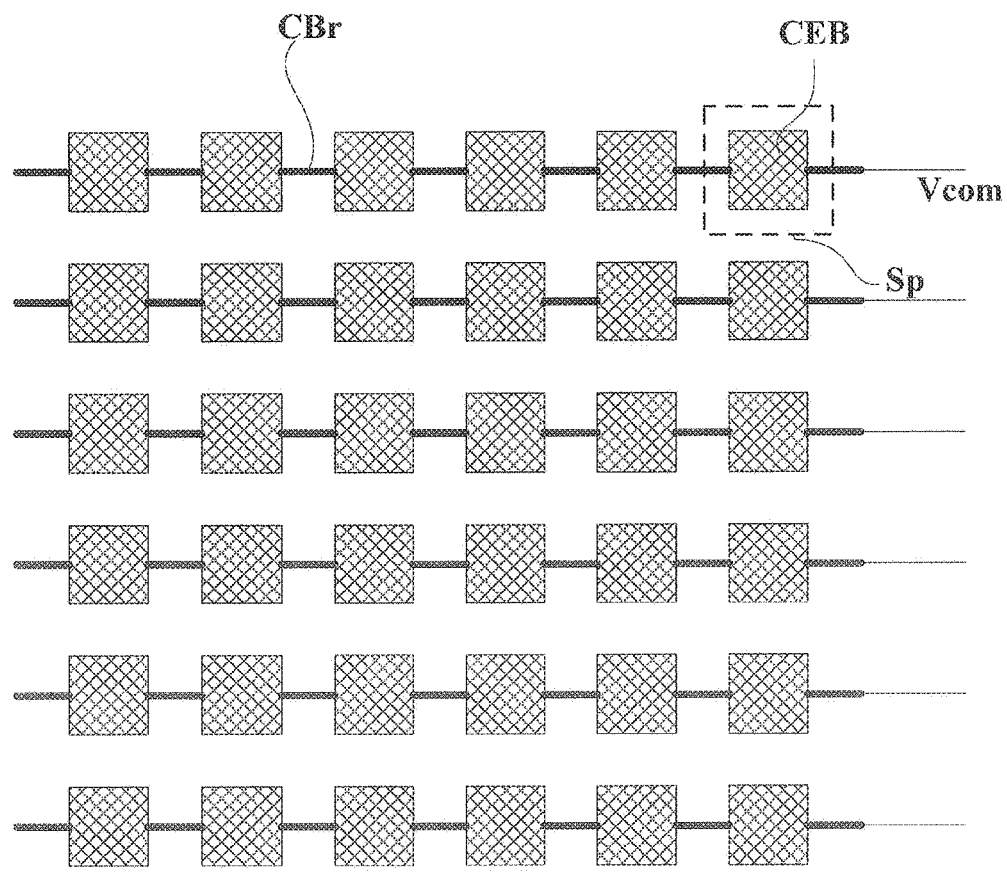
FIG. 8 is a schematic diagram illustrating the structure of a plurality of common electrode blocks in a plurality of touch detection regions in a fingerprint detection array substrate in some embodiments according to the present disclosure.
Figure 9:
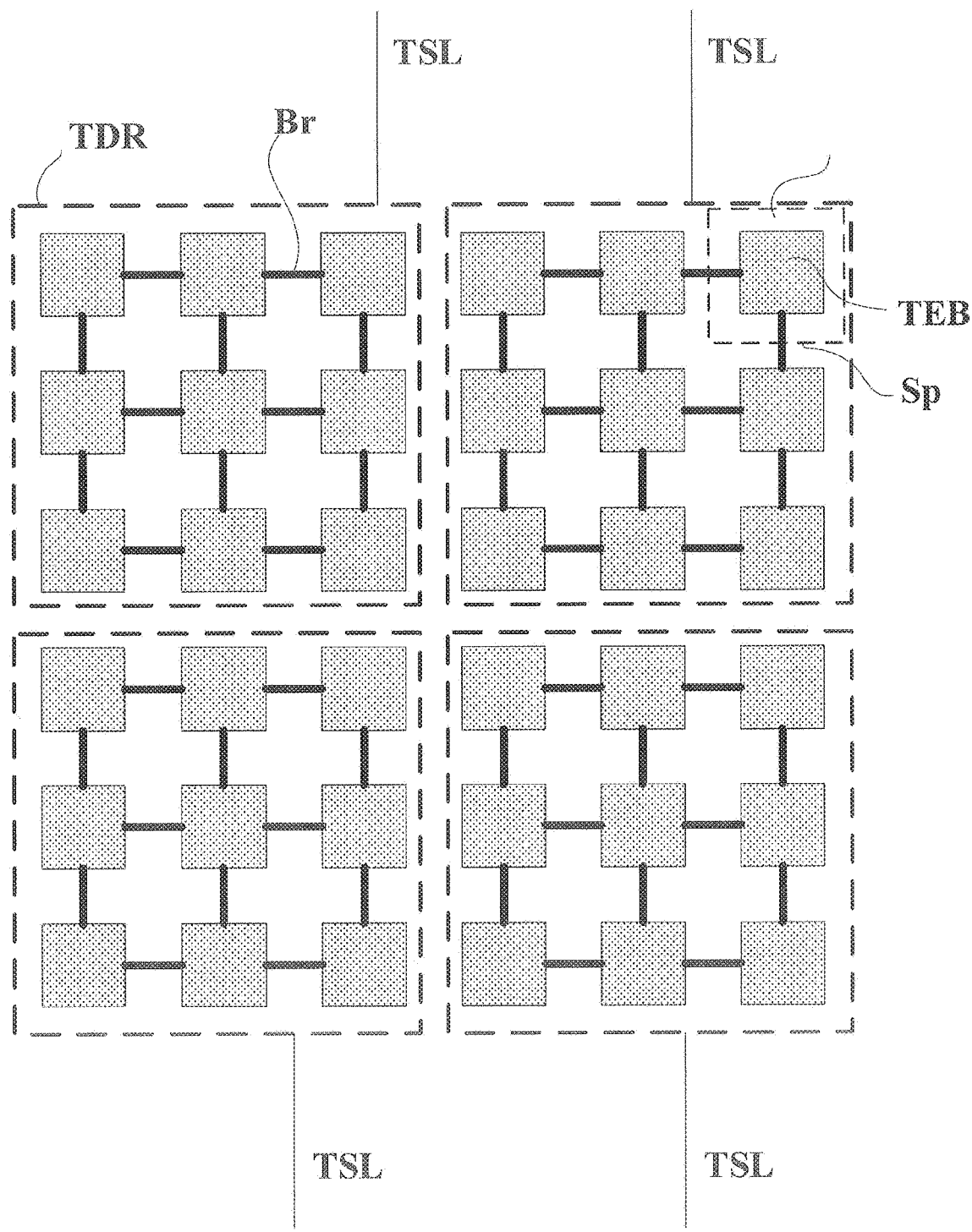
FIG. 9 is a schematic diagram illustrating the structure of a plurality of touch electrode blocks in a plurality of touch detection regions in a fingerprint detection array substrate in some embodiments according to the present disclosure.

In some embodiments, the fingerprint detection array substrate includes a plurality of touch electrode blocks and a common electrode layer having a plurality of common electrode blocks. A respective one of the plurality of common electrode blocks is electrically connected to a respective one of a plurality of photosensors of the fingerprint sensor, and configured to provide a common voltage to the respective one of the plurality of photosensors. FIG. 8 is a schematic diagram illustrating the structure of a plurality of common electrode blocks in a plurality of touch detection regions in a fingerprint detection array substrate in some embodiments according to the present disclosure. FIG. 9 is a schematic diagram illustrating the structure of a plurality of touch electrode blocks in a plurality of touch detection regions in a fingerprint detection array substrate in some embodiments according to the present disclosure. Referring to FIG. 8 and FIG. 9, the fingerprint detection array substrate in some embodiments includes a plurality of touch electrode blocks TEB and a plurality of common electrode blocks CEB in a plurality of touch detection regions TDR. Referring to FIG. 9, a respective one of the plurality of touch detection regions TDR includes multiple touch electrode blocks of the plurality of touch electrode blocks TEB. Touch electrode blocks in a respective one of the plurality of touch detection regions TDR are inter-connected through bridges Br, forming a touch electrode unit. The touch electrode unit is isolated from touch electrode blocks in adjacent touch detection regions of the plurality of touch detection regions TDR. Referring to FIG. 8, the plurality of common electrode blocks CEB form a plurality of rows of common electrode blocks. Optionally, common electrode blocks in a same row are inter-connected through common electrode bridges CBr. Optionally, common electrode blocks in a respective one of the plurality of rows of common electrode blocks are isolated from common electrode blocks in adjacent rows of the plurality of rows of common electrode blocks. Optionally, common electrode blocks in a same row are inter-connected through common electrode bridges CBr, and is electrically connected to a common voltage signal line Vcom in the peripheral area of the fingerprint detection array substrate.

Figure 10A:
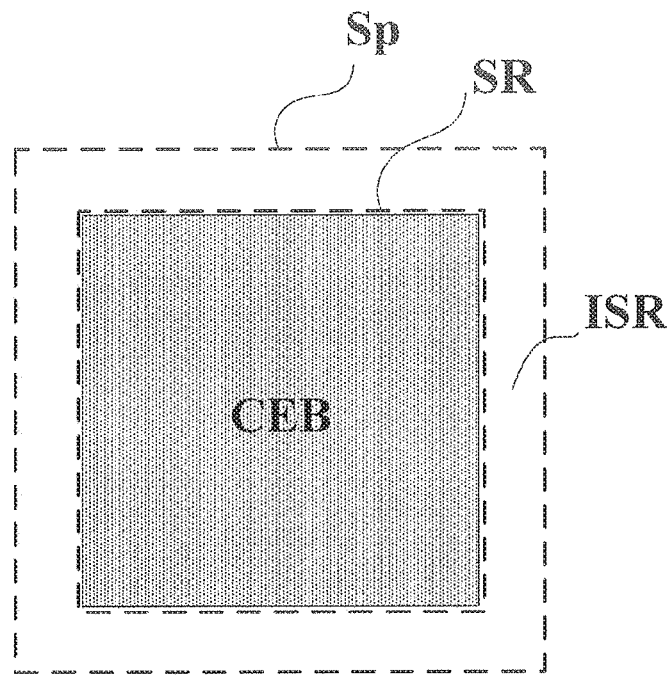
FIG. 10A is a schematic diagram illustrating the structure of a subpixel in a fingerprint detection array substrate in some embodiments according to the present disclosure.
Figure 10B:
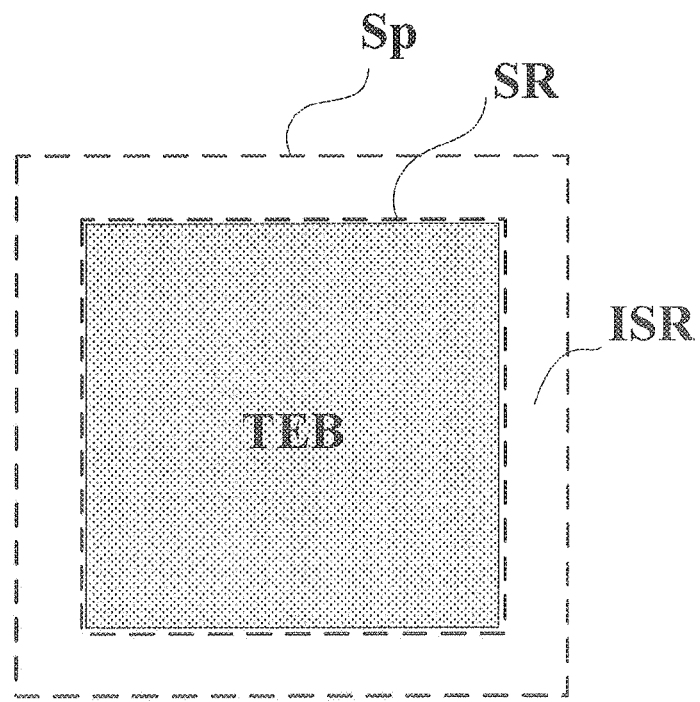
FIG. 10B is a schematic diagram illustrating the structure of a subpixel in a fingerprint detection array substrate in some embodiments according to the present disclosure.

FIG. 10A is a schematic diagram illustrating the structure of a subpixel in a fingerprint detection array substrate in some embodiments according to the present disclosure. FIG. 10B is a schematic diagram illustrating the structure of a subpixel in a fingerprint detection array substrate in some embodiments according to the present disclosure. Referring to FIG. 10A, a respective one of the plurality of common electrode blocks CEB extends substantially throughout a subpixel region SR of a respective subpixel Sp, and is substantially outside an inter-subpixel region ISR of the respective subpixel Sp. Referring to FIG. 10B, a respective one of the plurality of touch electrode blocks TEB extends substantially throughout a subpixel region SR of a respective subpixel Sp, and is substantially outside an inter-subpixel region ISR of the respective subpixel Sp. When the fingerprint detection array substrate includes the plurality of common electrode blocks, it is not necessary to operate the fingerprint detection array substrate in a time-division driving mode.

Figure 11A:
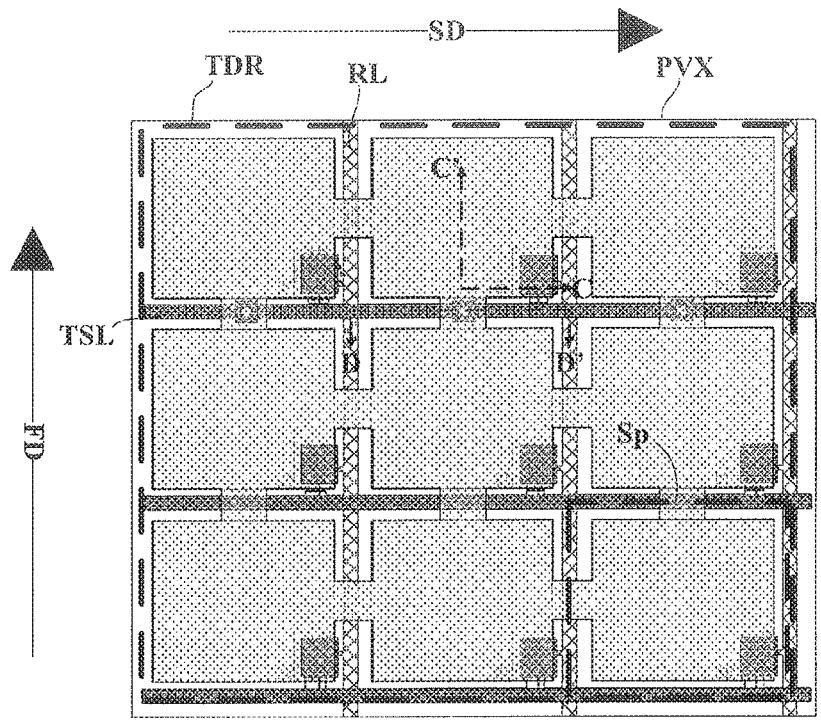
FIG. 11A is a plan view of a fingerprint detection array substrate in some embodiments according to the present disclosure.
Figure 11B:
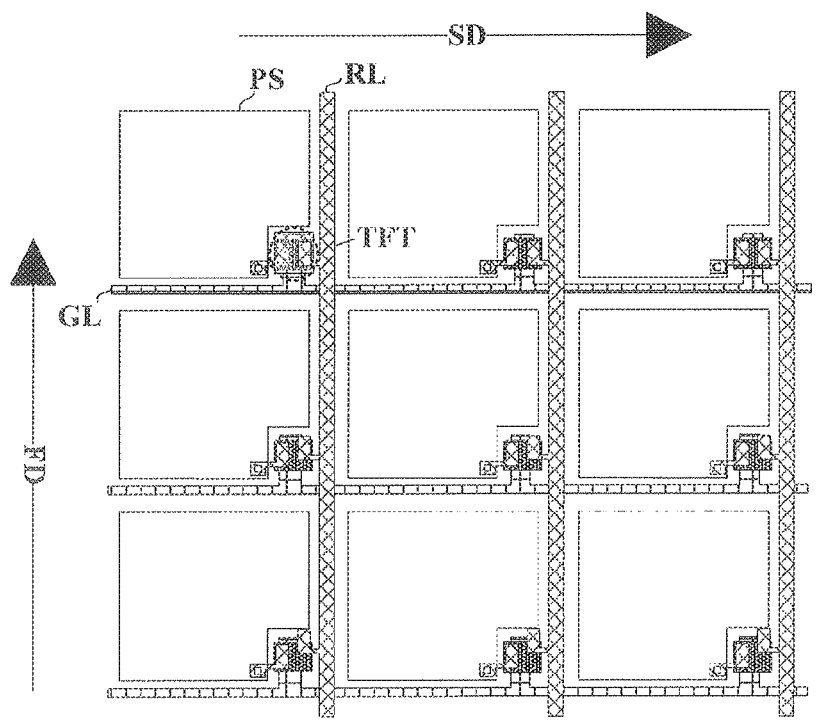
FIG. 11B is a plan view of a plurality of photosensors, a plurality of thin film transistors, a plurality of gate lines, and a plurality of read lines in a region corresponding to a touch electrode unit of a fingerprint detection array substrate in some embodiments according to the present disclosure.
Figure 11C:
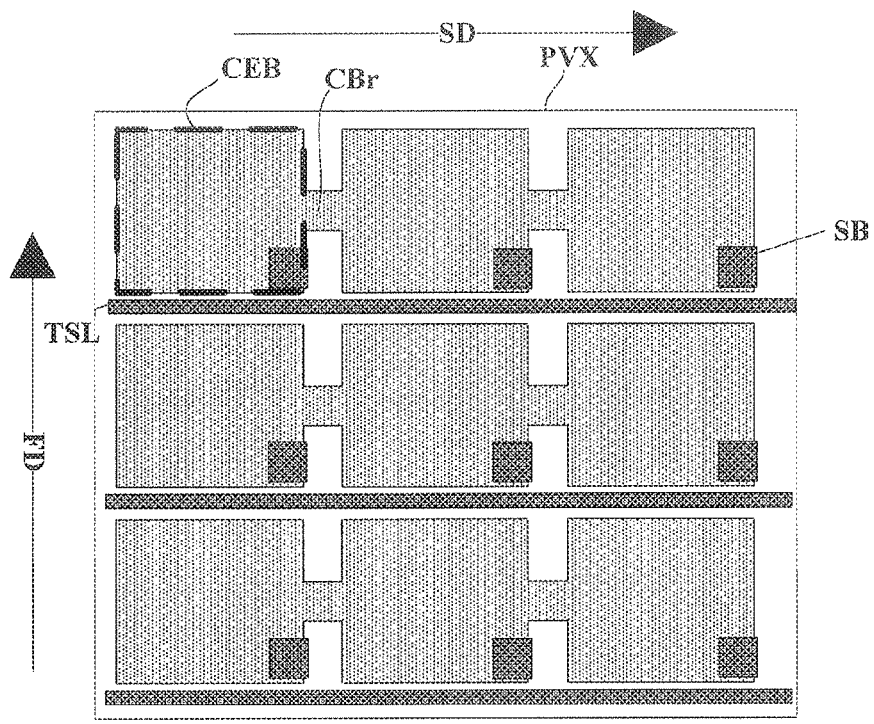
FIG. 11C is a plan view of a plurality of common electrode blocks, a plurality of touch signal lines, and a passivation layer on a side of the plurality of touch signal lines away from the plurality of common electrode blocks, in a region corresponding to a touch electrode unit of a fingerprint detection array substrate in some embodiments according to the present disclosure.
Figure 11D:
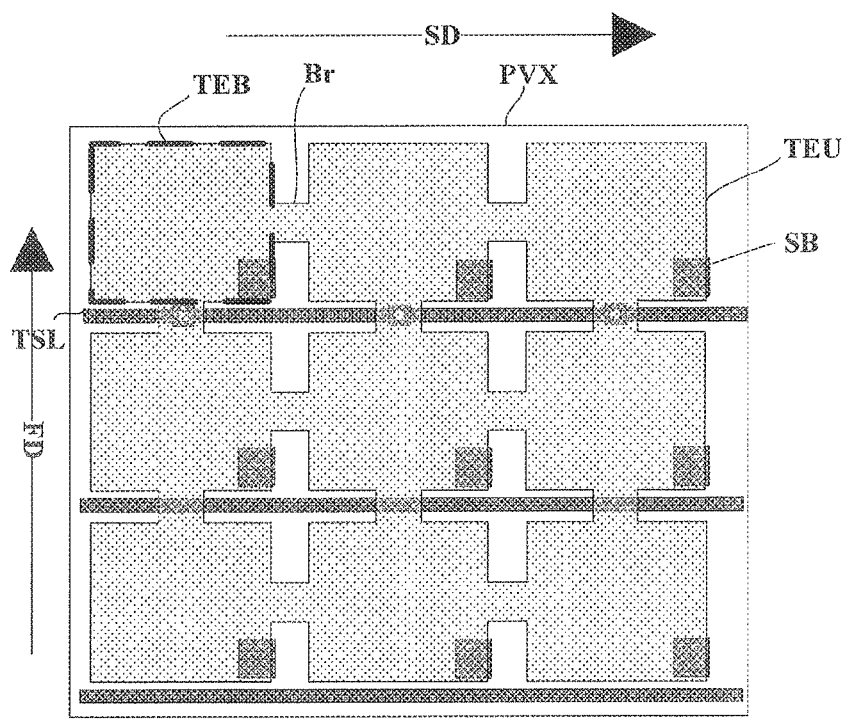
FIG. 11D is a plan view of a plurality of touch electrode blocks, a plurality of touch signal lines, and a passivation layer between the plurality of touch signal lines and the plurality of touch electrode blocks, in a region corresponding to a touch electrode unit of a fingerprint detection array substrate in some embodiments according to the present disclosure.

FIG. 11A is a plan view of a fingerprint detection array substrate in some embodiments according to the present disclosure. FIG. 11B is a plan view of a plurality of photosensors, a plurality of thin film transistors, a plurality of gate lines, and a plurality of read lines in a region corresponding to a touch electrode unit of a fingerprint detection array substrate in some embodiments according to the present disclosure. FIG. 11C is a plan view of a plurality of common electrode blocks, a plurality of touch signal lines, and a passivation layer on a side of the plurality of touch signal lines away from the plurality of common electrode blocks, in a region corresponding to a touch electrode unit of a fingerprint detection array substrate in some embodiments according to the present disclosure. FIG. 11D is a plan view of a plurality of touch electrode blocks, a plurality of touch signal lines, and a passivation layer between the plurality of touch signal lines and the plurality of touch electrode blocks, in a region corresponding to a touch electrode unit of a fingerprint detection array substrate in some embodiments according to the present disclosure. Referring to FIG. 11A to FIG. 11D, the fingerprint detection array substrate in some embodiments includes a plurality of gate lines GL and a plurality of read lines RL crossing over each other, defining a plurality of subpixels Sp. Optionally, the fingerprint detection array substrate further includes a plurality of touch signal lines TSL substantially parallel to the plurality of gate lines GL.

In some embodiments, the plurality of touch electrode blocks TEB are inter-connected through bridges Br, the plurality of touch electrode blocks TEB and the bridges Br forming a touch electrode unit TEU. As shown in FIG. 11A, FIG. 11D, and FIG. 9, the plurality of touch electrode blocks TEB in a respective one of the plurality of touch detection regions TDR are inter-connected through the bridges Br, forming the touch electrode unit TEU, and the touch electrode unit TEU is isolated from touch electrode blocks in adjacent touch detection regions of the plurality of touch detection regions TDR.

In some embodiments, common electrode blocks in a same row are inter-connected through common electrode bridges CBr. As shown in FIG. 11A, FIG. 11C, and FIG. 8, the plurality of touch signal lines TSL are arranged along a first direction FD, a respective one of the plurality of touch signal lines TSL extends along a second direction SD, the second direction SD is different from the first direction FD. Common electrode blocks in a row of the plurality of common electrode blocks CEB along the second direction SD are inter-connected through common electrode bridges CBr, and electrically connected to a common voltage source (e.g., through the common electrode signal line Vcom as shown in FIG. 8) in a peripheral area of the fingerprint detection array substrate.

Figure 12:
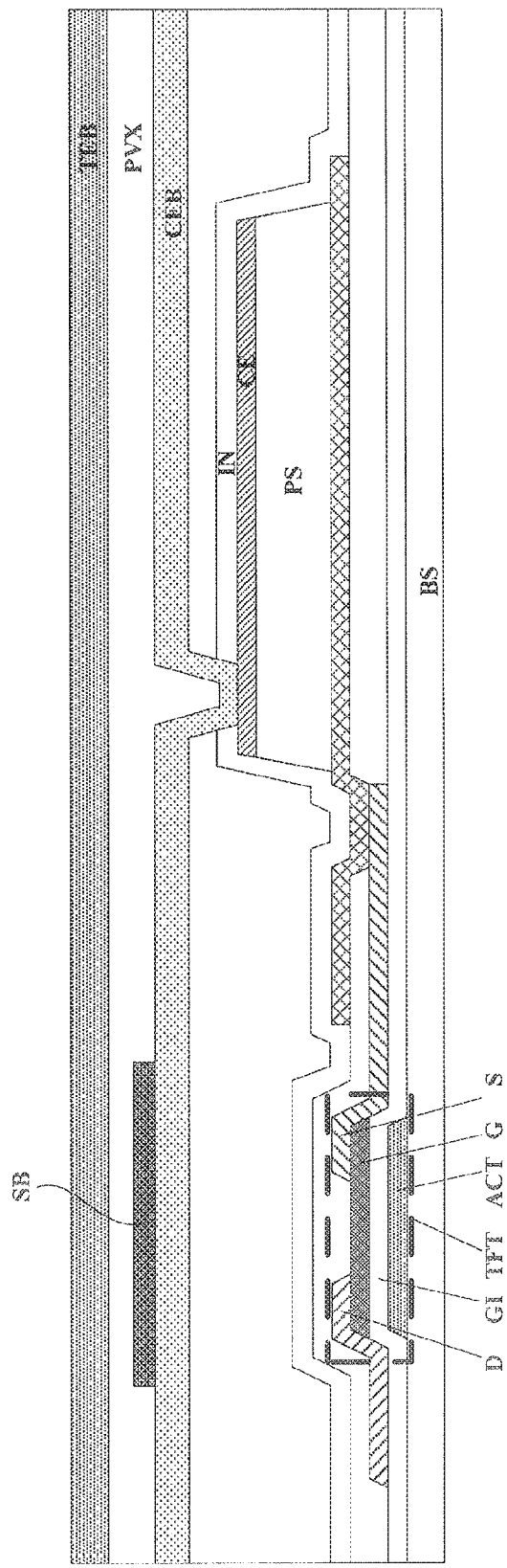
FIG. 12 is a cross-sectional view along a C-C' line in FIG. 10A.

FIG. 12 is a cross-sectional view along a C-C' line in FIG. 10A. Referring to FIGS. 11A-11D, and FIG. 12, in some embodiments, the fingerprint detection array substrate further includes a substantially transparent conductive electrode CE on a side of the respective one of the plurality of photosensors PS away from a base substrate BS; and an insulating layer IN on a side of the substantially transparent conductive electrode CE away from the respective one of the plurality of photosensors PS. Optionally, the substantially transparent conductive electrode CE is a bias electrode configured to provide a bias voltage to the respective one of the plurality of photosensors PS. The respective one of the plurality of common electrode blocks CEB extends through the insulating layer IN to connect with the substantially transparent conductive electrode CE. Optionally, the plurality of common electrode blocks CEB and the substantially transparent conductive electrode CE are made of a same material, e.g., indium tin oxide.

In some embodiments, the fingerprint detection array substrate further includes a plurality of thin film transistors ITT. A respective one of the plurality of thin film transistors TFT includes an active layer ACT, a gate electrode G, a source electrode S, and a drain electrode D. The respective one of the plurality of photosensors PS is electrically connected to the source electrode S. In some embodiments, the fingerprint detection array substrate further includes a shielding layer including a plurality of light shielding blocks SB configured to at least partially shield light from irradiating on the active layer ACT of the respective one of the plurality of thin film transistors TFT. Referring to FIG. 12, a respective one of the plurality of light shielding blocks SB is electrically connected to the respective one of the plurality of common electrode blocks CEB. Referring to FIGS. 11A to 11D, and FIG. 12, an orthographic projection of the respective one of the plurality of light shielding blocks SB on the base substrate BS at least partially overlaps with an orthographic projection of the active layer ACT of the respective one of the plurality of thin film transistors TFT on the base substrate BS. Optionally, the orthographic projection of the respective one of the plurality of light shielding blocks SB on the base substrate BS covers the orthographic projection of the active layer ACT of the respective one of the plurality of thin film transistors TFT on the base substrate BS. Optionally, the plurality of light shielding blocks SB and the plurality of touch signal lines TSL are in a same layer and includes a same conductive material, e.g., a same metallic material.

In some embodiments, the respective one of the plurality of light shielding blocks SB is in direct contact with the respective one of the plurality of common electrode blocks CEB without any intermediate layer, e.g., the fingerprint detection array substrate is absent of any intermediate layer spacing apart the respective one of the plurality of light shielding blocks SB from the respective one of the plurality of common electrode blocks CEB.

In some embodiments, the respective one of the plurality of light shielding blocks SB is isolated from the respective one of the plurality of touch electrode blocks TEB in a same subpixel. In some embodiments, the fingerprint detection array substrate further includes a passivation layer PVX between the respective one of the plurality of common electrode blocks CEB and the respective one of the plurality of touch electrode blocks TEB in the same subpixel. The respective one of the plurality of light shielding blocks SB is in direct contact with the respective one of the plurality of common electrode blocks CEB, and is isolated from the respective one of the plurality of touch electrode blocks TEB by the passivation layer PVX.

Figure 13:
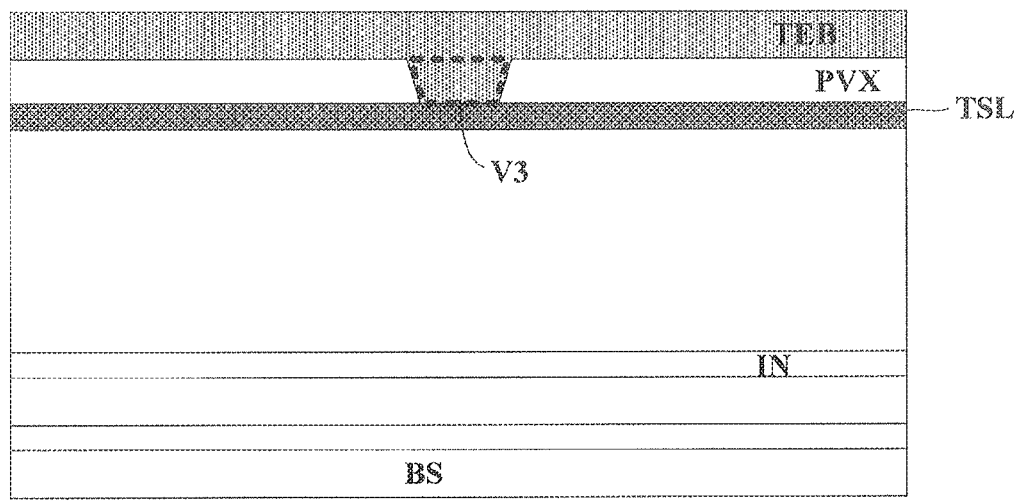
FIG. 13 is a cross-sectional view along a D-D' line in FIG. 10A.

FIG. 13 is a cross-sectional view along a D-D' line in FIG. 10A. Referring to FIG. 13, in some embodiments, the respective one of the plurality of touch electrode blocks TEB extends through the passivation layer PVX to connect to the respective one of the plurality of touch signal lines TSL. The fingerprint detection array substrate includes a third via V3 extending through the passivation layer PVX, and the respective one of the plurality of touch electrode blocks TEB extends through the third via V3 to connect to the respective one of the plurality of touch signal lines TSL.

Figure 14:
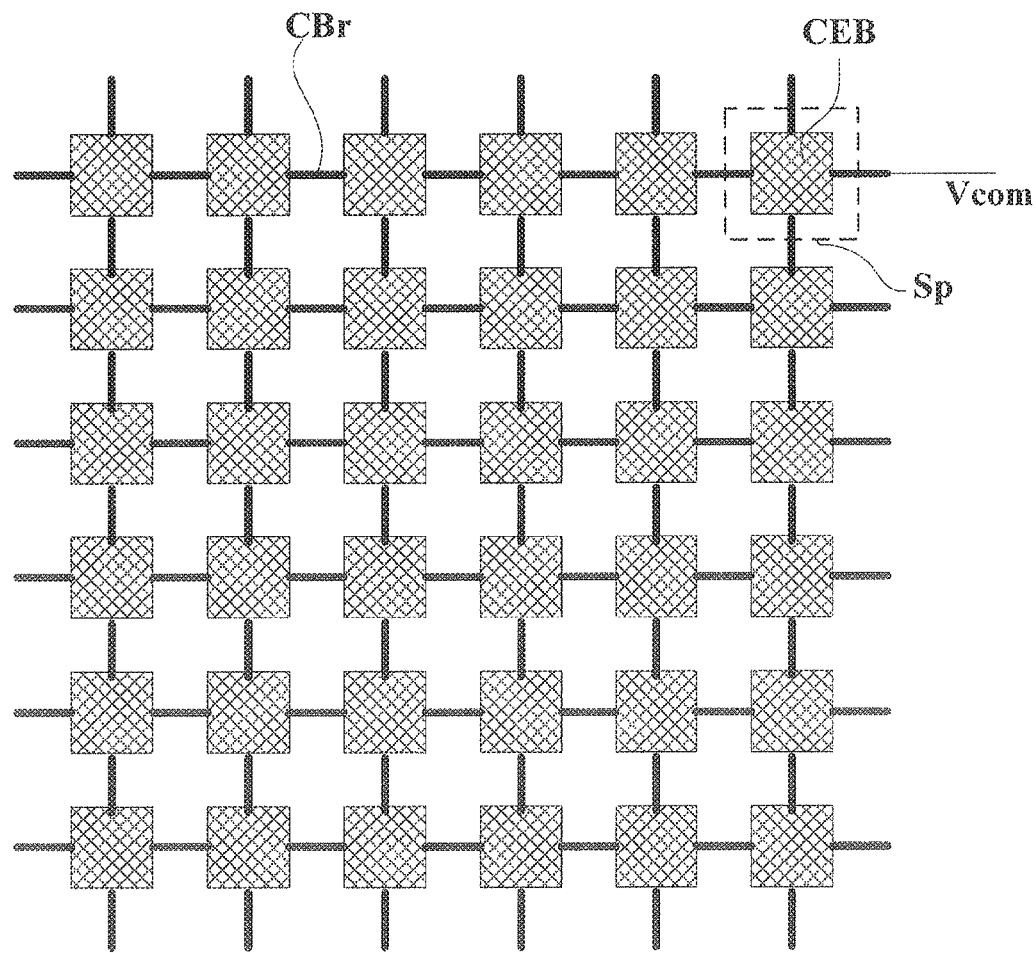
FIG. 14 is a schematic diagram illustrating the structure of a plurality of common electrode blocks in a plurality of touch detection regions in a fingerprint detection array substrate in some embodiments according to the present disclosure.
Figure 15:
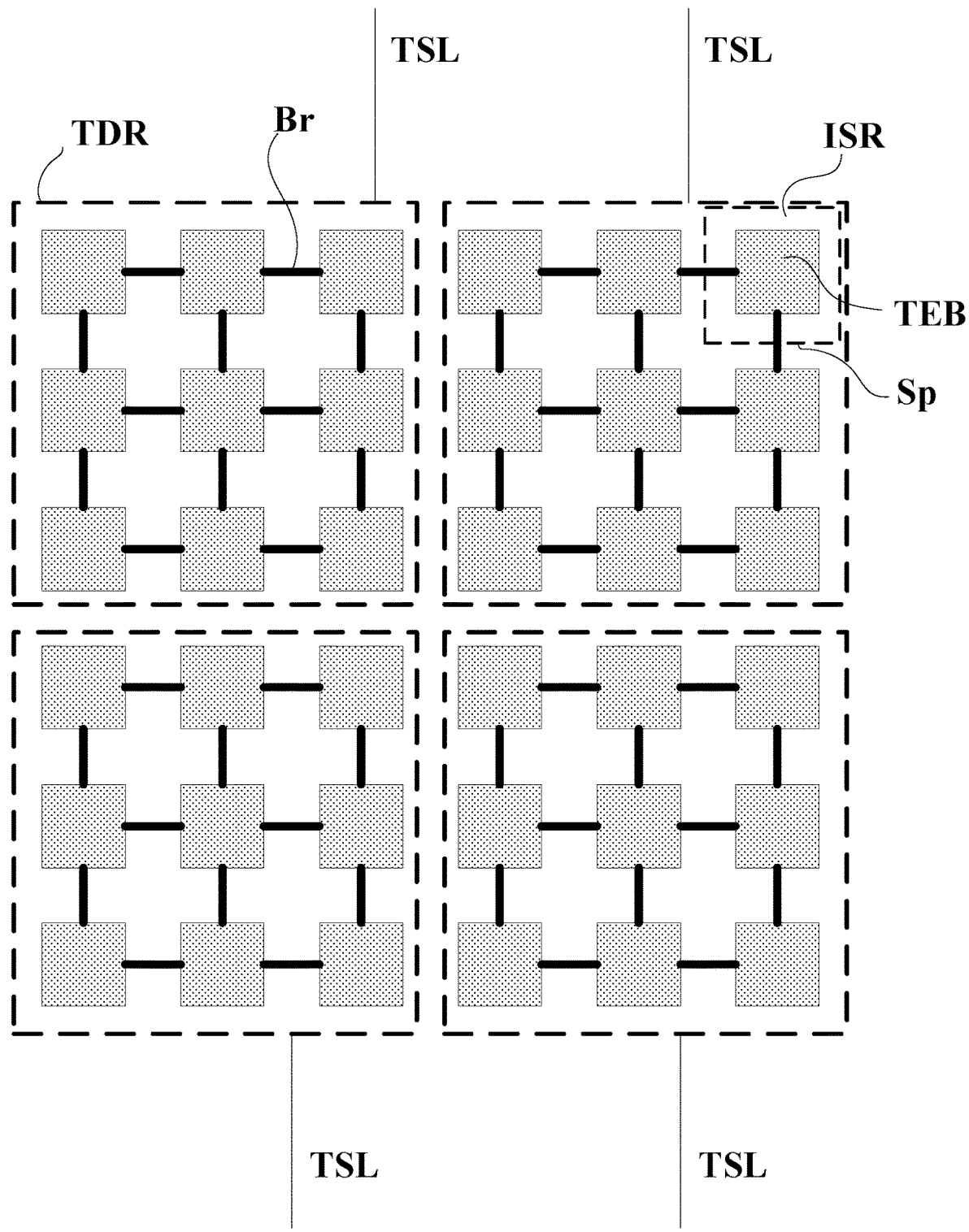
FIG. 15 is a schematic diagram illustrating the structure of a plurality of touch electrode blocks in a plurality of touch detection regions in a fingerprint detection array substrate in some embodiments according to the present disclosure.

In some embodiments, common electrode blocks of the plurality of common electrode blocks are inter-connected through common electrode bridges, and electrically connected to a common voltage source in a peripheral area of the fingerprint detection array substrate. Optionally, all of the plurality of common electrode blocks are inter-connected together through common electrode bridges. FIG. 14 is a schematic diagram illustrating the structure of a plurality of common electrode blocks in a plurality of touch detection regions in a fingerprint detection array substrate in some embodiments according to the present disclosure. The structure of the plurality of common electrode blocks CEB in FIG. 14 is similar to the structure of the plurality of common electrode blocks CEB as shown in FIG. 8, except that all of the plurality of common electrode blocks CEB are inter-connected together through common electrode bridges CBr. All of the plurality of common electrode blocks CEB are electrically connected to a common voltage source through a common voltage signal line Vcom in the peripheral area of the fingerprint detection array substrate. FIG. 15 is a schematic diagram illustrating the structure of a plurality of touch electrode blocks in a plurality of touch detection regions in a fingerprint detection array substrate in some embodiments according to the present disclosure. The structure of a plurality of touch electrode blocks TEB in FIG. 15 is largely similar to the structure of the plurality of touch electrode blocks TEB as shown in FIG. 9.

Figure 16A:
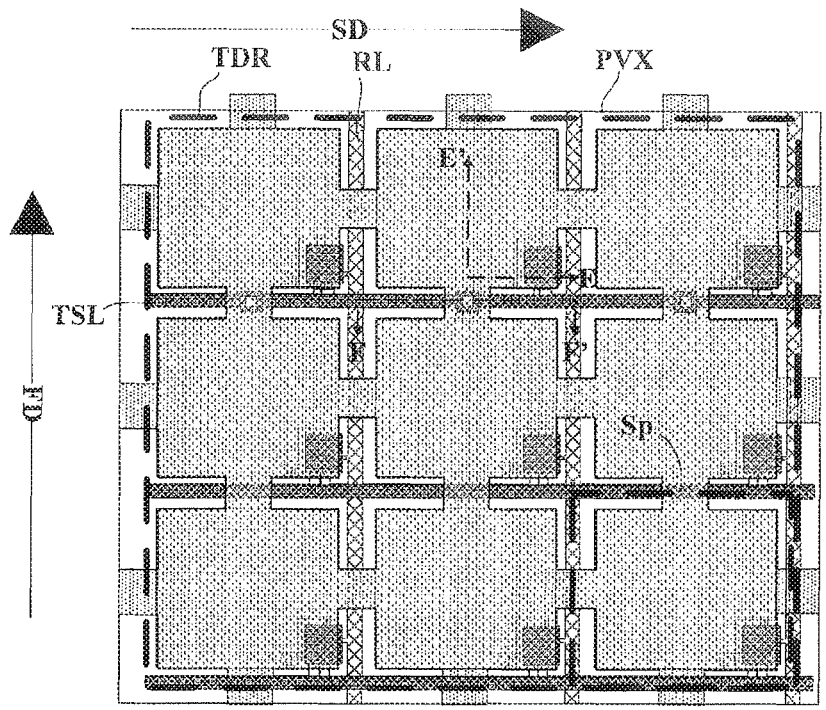
FIG. 16A is a plan view of a fingerprint detection array substrate in some embodiments according to the present disclosure.
Figure 16B:
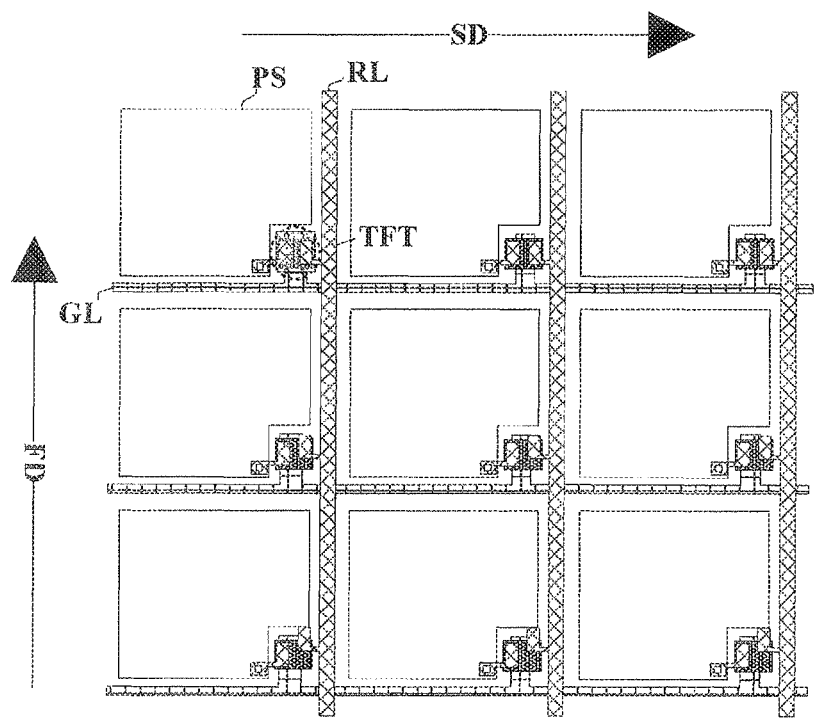
FIG. 16B is a plan view of a plurality of photosensors, a plurality of thin film transistors, a plurality of gate lines, and a plurality of read lines in a region corresponding to a touch electrode unit of a fingerprint detection array substrate in some embodiments according to the present disclosure.
Figure 16C:
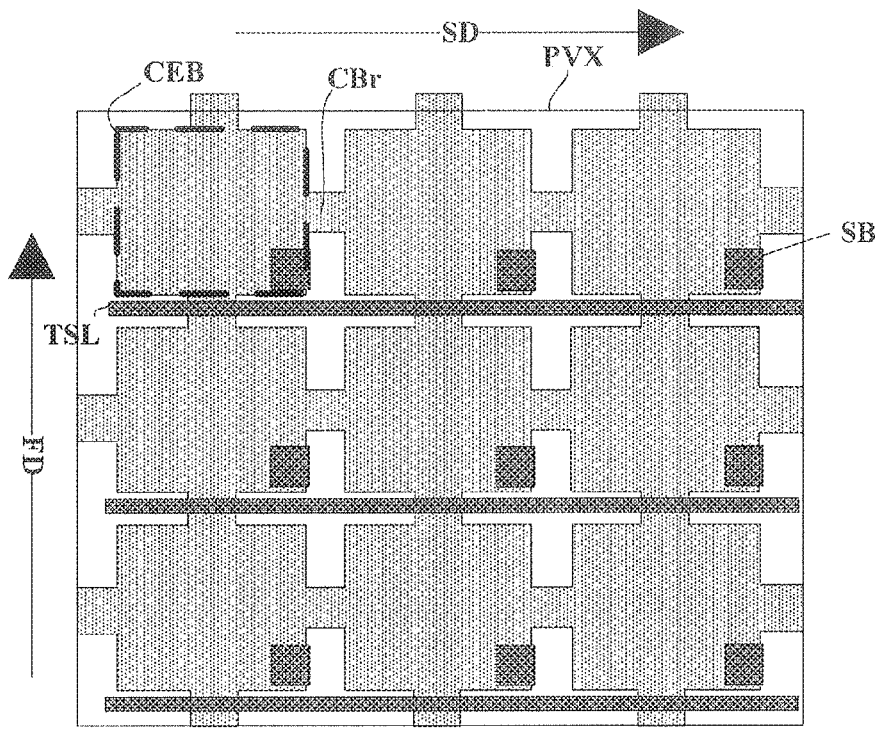
FIG. 16C is a plan view of a plurality of common electrode blocks, a plurality of touch signal lines, and a passivation layer on a side of the plurality of touch signal lines away from the plurality of common electrode blocks, in a region corresponding to a touch electrode unit of a fingerprint detection array substrate in some embodiments according to the present disclosure.
Figure 16D:
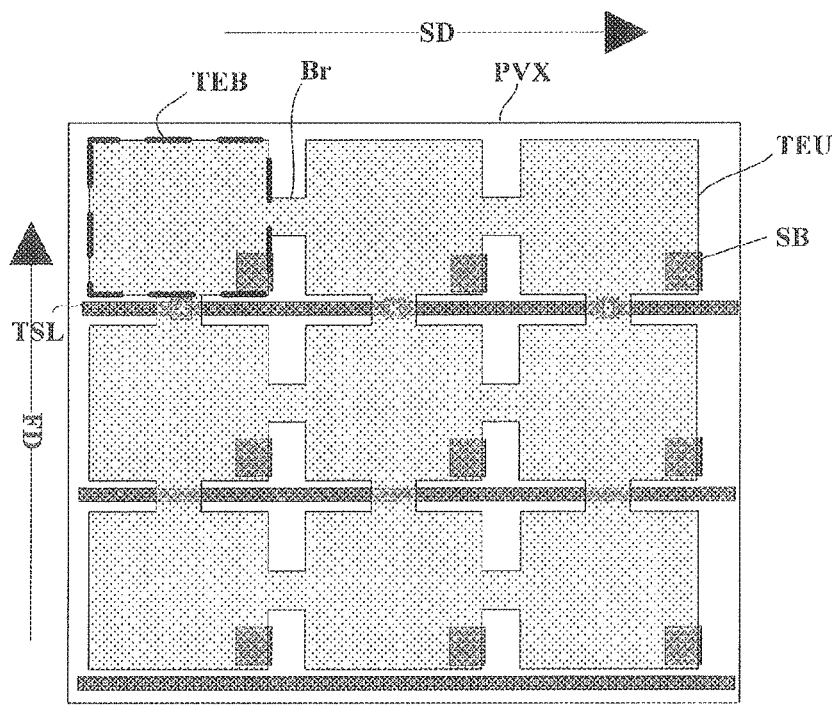
FIG. 16D is a plan view of a plurality of touch electrode blocks, a plurality of touch signal lines, and a passivation layer between the plurality of touch signal lines and the plurality of touch electrode blocks, in a region corresponding to a touch electrode unit of a fingerprint detection array substrate in some embodiments according to the present disclosure.

FIG. 16A is a plan view of a fingerprint detection array substrate in some embodiments according to the present disclosure. FIG. 16B is a plan view of a plurality of photosensors, a plurality of thin film transistors, a plurality of gate lines, and a plurality of read lines in a region corresponding to a touch electrode unit of a fingerprint detection array substrate in some embodiments according to the present disclosure. FIG. 16C is a plan view of a plurality of common electrode blocks, a plurality of touch signal lines, and a passivation layer on a side of the plurality of touch signal lines away from the plurality of common electrode blocks, in a region corresponding to a touch electrode unit of a fingerprint detection array substrate in some embodiments according to the present disclosure. FIG. 16D is a plan view of a plurality of touch electrode blocks, a plurality of touch signal lines, and a passivation layer between the plurality of touch signal lines and the plurality of touch electrode blocks, in a region corresponding to a touch electrode unit of a fingerprint detection array substrate in some embodiments according to the present disclosure. As shown in FIG. 16C, the plurality of common electrode blocks CEB are all inter-connected together through the common electrode bridges CBr.

Figure 17:
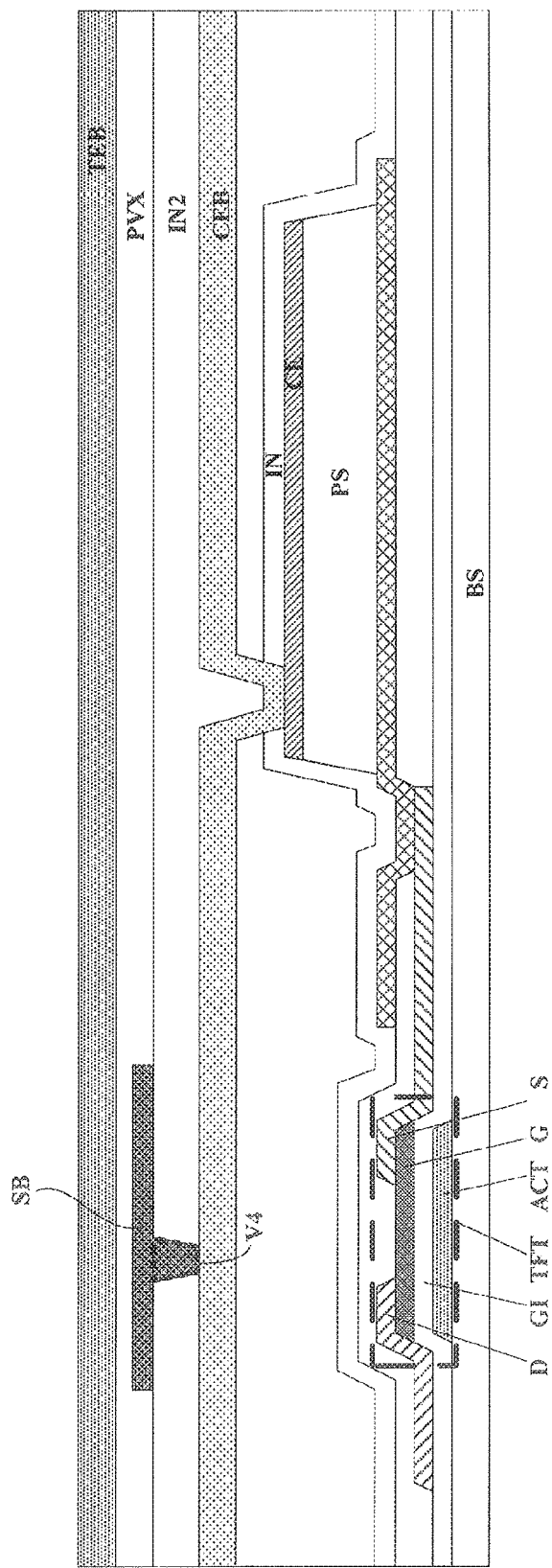
FIG. 17 is a cross-sectional view along an E-E' line in FIG. 16A.

FIG. 17 is a cross-sectional view along an E-E' line in FIG. 16A. Referring to FIGS. 16A-16D, and FIG. 17, the respective one of the plurality of common electrode blocks CEB extends through the insulating layer IN to connect with the substantially transparent conductive electrode CE. In some embodiments, the fingerprint detection array substrate further includes a second insulating layer IN2 on a side of the respective one of the plurality of common electrode blocks CEB away from the base substrate BS. The respective one of the plurality of light shielding blocks SB extends through the second insulating layer IN2 to connect with the respective one of the plurality of common electrode blocks CEB. The fingerprint detection array substrate includes a fourth via V4 extending through the second insulating layer IN2, and the respective one of the plurality of light shielding blocks SB extends through the fourth via V4 to connect with the respective one of the plurality of common electrode blocks CEB.

In some embodiments, the fingerprint detection array substrate further includes a passivation layer PVX between the respective one of the plurality of common electrode blocks CEB and the respective one of the plurality of touch electrode blocks TEB in the same subpixel. The respective one of the plurality of light shielding blocks SB is in direct contact with the respective one of the plurality of common electrode blocks CEB, and is isolated from the respective one of the plurality of touch electrode blocks TEB by the passivation layer PVX.

Figure 18:
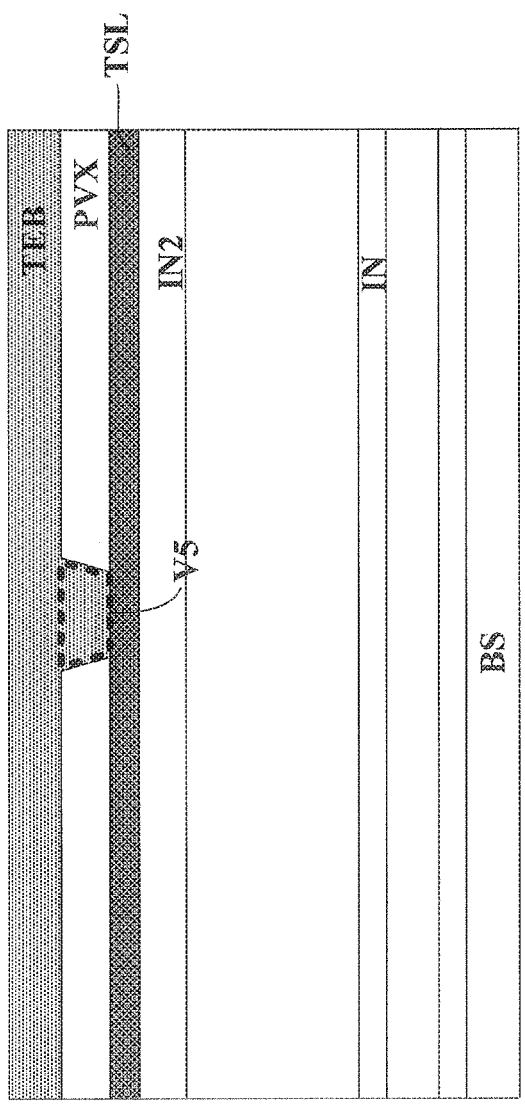
FIG. 18 is a cross-sectional view along an F-F' line in FIG. 16A.

FIG. 18 is a cross-sectional view along an F-F' line in FIG. 16A. Referring to FIGS. 16A-16D, and FIG. 18, the respective one of the plurality of touch electrode blocks TEB extends through the passivation layer PVX to connect to the respective one of the plurality of touch signal lines TSL. The fingerprint detection array substrate includes a fifth via V5 extending through the passivation layer PVX, and the respective one of the plurality of touch electrode blocks TEB extends through the fifth via V5 to connect to the respective one of the plurality of touch signal lines TSL.

Figure 19:
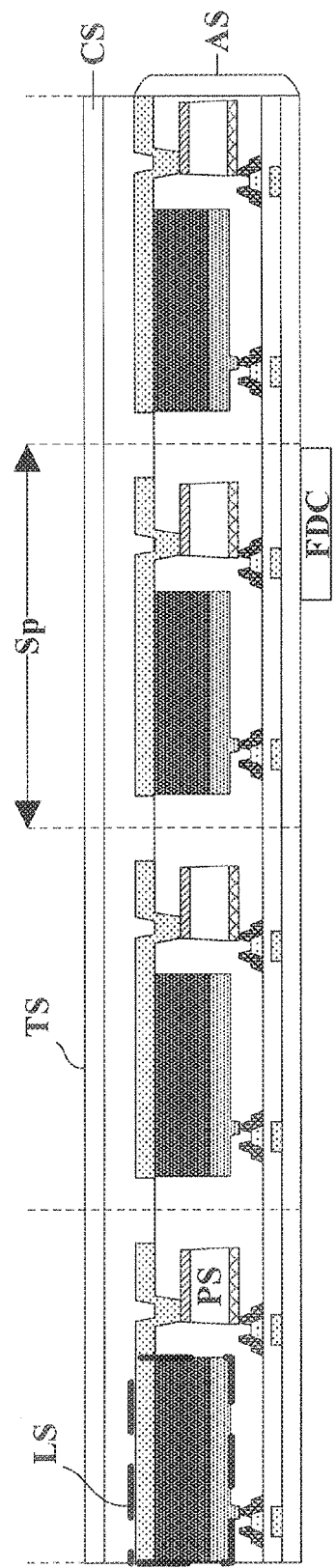
FIG. 19 is a schematic diagram illustrating the structure of a fingerprint detection apparatus in some embodiments according to the present disclosure.

In another aspect, the present disclosure provides a fingerprint detection apparatus. In some embodiments, the fingerprint detection apparatus includes the fingerprint detection array substrate described herein; and a counter substrate facing the fingerprint detection array substrate. FIG. 19 is a schematic diagram illustrating the structure of a fingerprint detection apparatus in some embodiments according to the present disclosure. Referring to FIG. 19, the fingerprint sensor in some embodiments includes a plurality of light sources LS configured to emit light toward the counter substrate CS, at least a portion of the light being totally reflected by a surface TS of the counter substrate CS facing away the fingerprint detection array substrate AS; a plurality of photosensors PS in the fingerprint detection array substrate AS, and configured to detect the portion of the light totally reflected by the surface TS of the counter substrate CS facing away the fingerprint detection array substrate AS; and a fingerprint detection driver circuit FDC electrically connected to a plurality of photosensors PS, and configured to independently control fingerprint detection respectively in a plurality of fingerprint scanning regions.

In some embodiments, the plurality of light sources are a plurality of light emitting diodes such as organic light emitting diodes or micro light emitting diodes. In some embodiments, the fingerprint detection apparatus is a fingerprint detection display apparatus that is configured to display an image. Optionally, the plurality of subpixels Sp of the fingerprint detection apparatus are the same as a plurality of subpixels for the purpose of display an image. Optionally, a respective one of the plurality of touch electrode blocks TEB is a cathode in a respective one of the plurality of light emitting diodes. Optionally, in the display mode, a common voltage is transmitted to the respective one of the plurality of touch electrode blocks TEB.

In another aspect, the present disclosure provides a method of operating a fingerprint detection apparatus. In some embodiments, the method includes detecting a touch position using a plurality of touch electrode blocks in a plurality of touch detection regions, wherein a respective one of the plurality of touch electrode blocks extends substantially throughout a subpixel region of a respective subpixel, and is substantially outside an inter-subpixel region of the respective subpixel, touch electrode blocks in a respective one of the plurality of touch detection regions are inter-connected through bridges, forming a touch electrode unit, the touch electrode unit is isolated from touch electrode blocks in adjacent touch detection regions of the plurality of touch detection regions; transmitting touch signals respectively through a plurality of touch signal lines to a plurality of touch detection regions, wherein a respective one of the plurality of touch signal lines is electrically connected to the touch electrode unit limited in the respective one of the plurality of touch detection regions; determining a fingerprint scanning region in which the touch position is detected; and performing fingerprint sensing limited in the fingerprint scanning region, wherein an area the fingerprint scanning region is a fraction of a total area of the plurality of touch detection regions.

In some embodiments, the method further includes operating the fingerprint detection apparatus in a time-division driving mode including a touch detection mode and a fingerprint detection mode. Referring to FIGS. 3, 4, 5A-5C, 6, and 7, in some embodiments, the respective one of the plurality of touch electrode blocks TEB is electrically connected to a respective one of a plurality of photosensors PS of the fingerprint sensor. Optionally, in the fingerprint detection mode, the method includes transmitting a common voltage by the respective one of the plurality of touch signal lines TSL to the respective one of the plurality of photosensors PS through the respective one of the plurality of touch electrode blocks TEB. Optionally, in the touch detection mode, the method includes transmitting a touch signal by the respective one of the plurality of touch signal lines TSL to the respective one of the plurality of touch detection regions TDR.

In some embodiments, the time-division driving mode further includes a display mode in which an image is displayed in a fingerprint detection display apparatus as shown in FIG. 19. Optionally, in the display mode, the method further includes transmitting a common voltage to the respective one of the plurality of touch electrode blocks TEB.

In some embodiments, and referring to FIGS. 8, 9, 10A-10B, 11A-11D, 12-15, 16A-16D, 17, and 18, the method further includes providing a common voltage to a respective one of a plurality of photosensors PS of a fingerprint sensor through a respective one of a plurality of common electrode blocks CEB, wherein a respective one of the plurality of common electrode blocks CEB extends substantially throughout the subpixel region SR of the respective subpixel Sp, and is substantially outside the inter-subpixel region ISR of the respective subpixel Sp, the respective one of the plurality of common electrode blocks CEB is electrically connected to the respective one of the plurality of photosensors PS.

In another aspect, the present disclosure provides a method of fabricating a fingerprint detection array substrate. In some embodiments, the method includes forming a plurality of touch electrode blocks in a plurality of touch detection regions configured to detect a touch position, wherein a respective one of the plurality of touch electrode blocks extends substantially throughout a subpixel region of a respective subpixel, and is substantially outside an inter-subpixel region of the respective subpixel, touch electrode blocks in a respective one of the plurality of touch detection regions are inter-connected through bridges, forming a touch electrode unit, and the touch electrode unit is isolated from touch electrode blocks in adjacent touch detection regions of the plurality of touch detection regions; forming a plurality of touch signal lines configured to respectively transmit touch signals to a plurality of touch detection regions, wherein a respective one of the plurality of touch signal lines is electrically connected to the touch electrode unit limited in the respective one of the plurality of touch detection regions; forming a processor configure to determine a fingerprint scanning region including one or more touch detection regions in which the touch position is detected; and forming a fingerprint sensor configured to perform fingerprint sensing limited in the fingerprint scanning region, wherein an area of the fingerprint scanning region is a fraction of a total area of the plurality of touch detection regions.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A fingerprint detection array substrate, comprising:
a plurality of touch electrode blocks in a plurality of touch detection regions configured to detect a touch position, wherein a respective one of the plurality of touch electrode blocks extends substantially throughout a subpixel region of a respective subpixel, and is substantially outside an inter-subpixel region of the respective subpixel, touch electrode blocks in a respective one of the plurality of touch detection regions are inter-connected through bridges, forming a touch electrode unit, and the touch electrode unit is isolated from touch electrode blocks in adjacent touch detection regions of the plurality of touch detection regions;
a plurality of touch signal lines configured to respectively transmit touch signals to the plurality of touch detection regions, wherein a respective one of the plurality of touch signal lines is electrically connected to the touch electrode unit limited in the respective one of the plurality of touch detection regions;
a processor configure to determine a fingerprint scanning region comprising one or more touch detection regions in which the touch position is detected; and
a fingerprint sensor configured to perform fingerprint sensing limited in the fingerprint scanning region, wherein an area of the fingerprint scanning region is a fraction of a total area of the plurality of touch detection regions.

2. The fingerprint detection array substrate of claim 1, wherein the respective one of the plurality of touch electrode blocks is electrically connected to a respective one of a plurality of photosensors of the fingerprint sensor.

3. The fingerprint detection array substrate of claim 2, further comprising:
   a substantially transparent conductive electrode on a side of the respective one of the plurality of photosensors away from a base substrate; and
   an insulating layer on a side of the substantially transparent conductive electrode away from the respective one of the plurality of photosensors;
   wherein the respective one of the plurality of touch electrode blocks extends through the insulating layer to connect with the substantially transparent conductive electrode.

4. The fingerprint detection array substrate of claim 3, wherein the plurality of touch electrode blocks and the substantially transparent conductive electrode are made of a same material.

5. The fingerprint detection array substrate of claim 2, further comprising:
   a plurality of thin film transistors respectively electrically connected to the plurality of photosensors; and
   a shielding layer comprising a plurality of light shielding blocks configured to at least partially shield light from irradiating on active layers of the plurality of thin film transistors;
   wherein a respective one of the plurality of light shielding blocks is electrically connected to the respective one of the plurality of touch electrode blocks; and
   an orthographic projection of the respective one of the plurality of light shielding blocks on a base substrate at least partially overlaps with an orthographic projection of an active layer of a respective one of the plurality of thin film transistors on the base substrate.

6. The fingerprint detection array substrate of claim 5, wherein the plurality of light shielding blocks and the plurality of touch signal lines are in a same layer and comprise a same conductive material.

7. The fingerprint detection array substrate of claim 5, further comprising a passivation layer between the respective one of the plurality of light shielding blocks and the respective one of the plurality of touch electrode blocks;
   wherein the respective one of the plurality of light shielding blocks extends through the passivation layer to connect to the respective one of the plurality of touch electrode blocks; and
   the respective one of the plurality of touch signal lines extends through the passivation layer to connect to the respective one of the plurality of touch electrode blocks.

8. The fingerprint detection array substrate of claim 1, further comprising a common electrode layer comprising a plurality of common electrode blocks, wherein a respective one of the plurality of common electrode blocks extends substantially throughout the subpixel region of the respective subpixel, and is substantially outside the inter-subpixel region of the respective subpixel;
   wherein the respective one of the plurality of common electrode blocks is electrically connected to a respective one of a plurality of photosensors of the fingerprint sensor, and configured to provide a common voltage to the respective one of the plurality of photosensors.

9. The fingerprint detection array substrate of claim 8, further comprising:
   a substantially transparent conductive electrode on a side of the respective one of the plurality of photosensors away from a base substrate; and
   an insulating layer on a side of the substantially transparent conductive electrode away from the respective one of the plurality of photosensors;
   wherein the respective one of the plurality of common electrode blocks extends through the insulating layer to connect with the substantially transparent conductive electrode.

10. The fingerprint detection array substrate of claim 9, wherein the plurality of common electrode blocks and the substantially transparent conductive electrode are made of a same material.

11. The fingerprint detection array substrate of claim 8, further comprising:
    a plurality of thin film transistors respectively electrically connected to the plurality of photosensors; and
    a shielding layer comprising a plurality of light shielding blocks configured to at least partially shield light from irradiating on active layers of the plurality of thin film transistors;
    wherein a respective one of the plurality of light shielding blocks is electrically connected to the respective one of the plurality of common electrode blocks; and
    an orthographic projection of the respective one of the plurality of light shielding blocks on a base substrate at least partially overlaps with an orthographic projection of an active layer of a respective one of the plurality of thin film transistors on the base substrate.

12. The fingerprint detection array substrate of claim 11, wherein the plurality of light shielding blocks and the plurality of touch signal lines are in a same layer and comprise a same conductive material.

13. The fingerprint detection array substrate of claim 11, wherein the respective one of the plurality of light shielding blocks is in direct contact with the respective one of the plurality of common electrode blocks without any intermediate layer.

14. The fingerprint detection array substrate of claim 8, wherein the plurality of touch signal lines are arranged along a first direction, a respective one of the plurality of touch signal lines extends along a second direction, the second direction is different from the first direction; and
    common electrode blocks in a row of the plurality of common electrode blocks along the second direction are inter-connected through common electrode bridges, and electrically connected to a common voltage source in a peripheral area of the fingerprint detection array substrate.

15. The fingerprint detection array substrate of claim 8, further comprising a second insulating layer between the plurality of touch signal lines and the common electrode layer;
    wherein all of the plurality of common electrode blocks are inter-connected through common electrode bridges, and electrically connected to a common voltage source in a peripheral area of the fingerprint detection array substrate.

16. A fingerprint detection apparatus, comprising the fingerprint detection array substrate of claim 1, and a counter substrate facing the fingerprint detection array substrate;
    wherein the fingerprint sensor comprises:
    a plurality of light sources configured to emit light toward the counter substrate, at least a portion of the light being totally reflected by a surface of the counter substrate facing away the fingerprint detection array substrate;

a plurality of photosensors in the fingerprint detection array substrate, and configured to detect the portion of the light totally reflected by the surface of the counter substrate facing away the fingerprint detection array substrate; and a fingerprint detection driver circuit electrically connected to the plurality of photosensors, and configured to independently control fingerprint detection respectively in a plurality of fingerprint scanning regions.

17. A method of operating a fingerprint detection apparatus, comprising:

detecting a touch position using a plurality of touch electrode blocks in a plurality of touch detection regions, wherein a respective one of the plurality of touch electrode blocks extends substantially throughout a subpixel region of a respective subpixel, and is substantially outside an inter-subpixel region of the respective subpixel, touch electrode blocks in a respective one of the plurality of touch detection regions are inter-connected through bridges, forming a touch electrode unit, the touch electrode unit is isolated from touch electrode blocks in adjacent touch detection regions of the plurality of touch detection regions;

transmitting touch signals respectively through a plurality of touch signal lines to the plurality of touch detection regions, wherein a respective one of the plurality of touch signal lines is electrically connected to the touch electrode unit limited in the respective one of the plurality of touch detection regions;

determining a fingerprint scanning region comprising the touch position detected; and performing fingerprint sensing limited in the fingerprint scanning region, wherein an area of the fingerprint scanning region is a fraction of a total area of the plurality of touch detection regions.

18. The method of claim 17, further comprising operating the fingerprint detection apparatus in a time-division driving mode comprising a touch detection mode and a fingerprint detection mode, wherein the respective one of the plurality of touch electrode blocks is electrically connected to a respective one of a plurality of photosensors of a fingerprint sensor;

in the fingerprint detection mode, transmitting a common voltage by the respective one of the plurality of touch signal lines to the respective one of the plurality of photosensors through the respective one of the plurality of touch electrode blocks; and in the touch detection mode, transmitting a touch signal by the respective one of the plurality of touch signal lines to the respective one of the plurality of touch detection regions.

19. The method of claim 17, further comprising providing a common voltage to a respective one of a plurality of photosensors of a fingerprint sensor through a respective one of a plurality of common electrode blocks, wherein a respective one of the plurality of common electrode blocks extends substantially throughout the subpixel region of the respective subpixel, and is substantially outside the inter-subpixel region of the respective subpixel, the respective one of the plurality of common electrode blocks is electrically connected to the respective one of the plurality of photosensors.

* * * * *